United States Patent
Taguchi et al.

[11] Patent Number: 6,121,632
[45] Date of Patent: Sep. 19, 2000

[54] THIN-FILM TRANSISTOR ARRAY AND METHOD FOR MANUFACTURING SAME

[75] Inventors: Naoyuki Taguchi; Susumu Ohi, both of Tokyo, Japan

[73] Assignee: NEC Corporation, Tokyo, Japan

[21] Appl. No.: 09/092,944

[22] Filed: Jun. 8, 1998

[30] Foreign Application Priority Data

Jun. 9, 1997 [JP] Japan ................................ 9-166529

[51] Int. Cl.⁷ .................................................. H01L 29/00
[52] U.S. Cl. ........................ 257/57; 257/72; 257/347; 257/348; 257/349; 257/350; 257/351; 257/352; 257/353; 257/354; 257/355
[58] Field of Search ........................ 257/59, 72, 347–355

[56] References Cited

U.S. PATENT DOCUMENTS 5,428,250   6/1995   Ikeda et al. ................................ 257/59
5,731,216   3/1998   Holmberg et al. ......................... 257/59
5,889,573   3/1999   Yamamoto et al. ....................... 257/59

FOREIGN PATENT DOCUMENTS 6-208137    7/1994   Japan .
7-325314   12/1995   Japan .
9-127548    5/1997   Japan .

*Primary Examiner*—Fetsum Abraham
*Attorney, Agent, or Firm*—Sughrue, Mion, Zinn, Macpeak & Seas, PLLC

[57] ABSTRACT

A high-quality thin-film transistor array. The gate insulating film below the pixel electrode is etched off in its entirely or along a slit extending along a drain bus line in order to simultaneously remove the residual a-Si produced due to defective patterning. The insulating film is interposed between a drain bus line and a pixel electrode to form a boundary separating layer therebetween. The reject ratio is suppressed by reducing the occurrence of point defects of semi-bright spots, ascribable to capacitative coupling to the pixel electrodes as a result of interconnection of the residual a-Si produced by defective patterning to the drain bus line.

32 Claims, 26 Drawing Sheets

100 : GLASS SUBSTRATE
101 : GATE ELECTRODE
102 : CHANNEL LAYER
103 : DRAIN ELECTRODE
104 : SOURCE ELECTRODE
106 : PIXEL ELECTRODE
107 : CONTACT LAYER
108 : STORAGE CAPACITANCE ELECTRODE
110 : THROUGH-HOLE
114 : GATE INSULTING FILM
115 : PASSIVATION FILM
117 : REMOVING PATTERN

| | GATE | | STORAGE CAPACITANCE |
|---|---|---|---|
| 101 : | ELECTRODE | 108 : | ELECTRODE |
| 102 : | CHANNEL LAYER | 110 : | THROUGH-HOLE |
| 103 : | DRAIN ELECTRODE | 111 : | GATE BUS LINE |
| 104 : | SOURCE ELECTRODE | 117 : | REMOVING PATTERN |
| 106 : | PIXEL ELECTRODE | | |

100: GLASS SUBSTRATE
101: GATE ELECTRODE
102: CHANNEL LAYER
103: DRAIN ELECTRODE
104: SOURCE ELECTRODE
106: PIXEL ELECTRODE
107: CONTACT LAYER
108: STORAGE CAPACITANCE ELECTRODE
110: THROUGH-HOLE
114: GATE INSULTING FILM
115: PASSIVATION FILM
117: REMOVING PATTERN

101: GATE ELECTRODE  110: THROUGH-HOLE
102: CHANNEL LAYER  111: GATE BUS LINE
103: DRAIN ELECTRODE  112: DRAIN BUS LINE
104: SOURCE ELECTRODE  116: RESIDUAL a-Si
106: PIXEL ELECTRODE  117: REMOVING PATTERN
108: STORAGE CAPACITANCE ELECTRODE

101 : GATE ELECTRODE
102 : CHANNEL LAYER
103 : DRAIN ELECTRODE
104 : SOURCE ELECTRODE
106 : PIXEL ELECTRODE
110 : THROUGH-HOLE
111 : GATE BUS LINE
112 : DRAIN BUS LINE
117 : REMOVING PATTERN

| 101 : | GATE ELECTRODE | 110 : | THROUGH-HOLE |
| 102 : | CHANNEL LAYER | 111 : | GATE BUS LINE |
| 103 : | DRAIN ELECTRODE | 112 : | DRAIN BUS LINE |
| 104 : | SOURCE ELECTRODE | 117 : | REMOVING PATTERN |
| 106 : | PIXEL ELECTRODE | | |

100 : GLASS SUBSTRATE
101 : GATE ELECTRODE
102 : CHANNEL LAYER
103 : DRAIN ELECTRODE
104 : SOURCE ELECTRODE
106 : PIXEL ELECTRODE
107 : CONTACT LAYER
110 : THROUGH-HOLE
114 : GATE INSULTING FILM
115 : PASSIVATION FILM

| 101 : | GATE ELECTRODE | 110 : THROUGH-HOLE |
| 102 : | CHANNEL LAYER | 111 : GATE BUS LINE |
| 103 : | DRAIN ELECTRODE | 112 : DRAIN BUS LINE |
| 104 : | SOURCE ELECTRODE | 116 : RESIDUAL a-Si |
| 106 : | PIXEL ELECTRODE | 117 : REMOVING PATTERN |

100 : GLASS SUBSTRATE  106 : PIXEL ELECTRODE  112 : DRAIN BUS LINE  114 : GATE INSULTING FILM  115 : PASSIVATION FILM  116 : RESIDUAL a-Si  117 : REMOVING PATTERN

101 : GATE ELECTRODE
102 : CHANNEL LAYER
103 : DRAIN ELECTRODE
104 : SOURCE ELECTRODE
106 : PIXEL ELECTRODE
108 : STORAGE CAPACITANCE ELECTRODE
110 : THROUGH-HOLE
111 : GATE BUS LINE
112 : DRAIN BUS LINE
118 : REMOVING PATTERN

- 100 : GLASS SUBSTRATE
- 101 : GATE ELECTRODE
- 102 : CHANNEL LAYER
- 103 : DRAIN ELECTRODE
- 104 : SOURCE ELECTRODE
- 106 : PIXEL ELECTRODE
- 107 : CONTACT LAYER
- 108 : STORAGE CAPACITANCE ELECTRODE
- 110 : THROUGH-HOLE
- 114 : GATE INSULTING FILM
- 115 : PASSIVATION FILM
- 118 : REMOVING PATTERN

101 : GATE ELECTRODE
102 : CHANNEL LAYER
103 : DRAIN ELECTRODE
104 : SOURCE ELECTRODE
106 : PIXEL ELECTRODE
108 : STORAGE CAPACITANCE ELECTRODE
111 : GATE BUS LINE
112 : DRAIN BUS LINE
113 : PA OPENING PATTERN

100 : GLASS SUBSTRATE
101 : GATE ELECTRODE
102 : CHANNEL LAYER
103 : DRAIN ELECTRODE
104 : SOURCE ELECTRODE
106 : PIXEL ELECTRODE
107 : CONTACT LAYER
108 : STORAGE CAPACITANCE ELECTRODE
114 : GATE INSULTING FILM
115 : PASSIVATION FILM

101 : GATE ELECTRODE
102 : CHANNEL LAYER
103 : DRAIN ELECTRODE
104 : SOURCE ELECTRODE
106 : PIXEL ELECTRODE
108 : STORAGE CAPACITANCE ELECTRODE
111 : GATE BUS LINE
112 : DRAIN BUS LINE
113 : PA OPENING PATTERN

FIG. 19   PRIOR ART
(a)
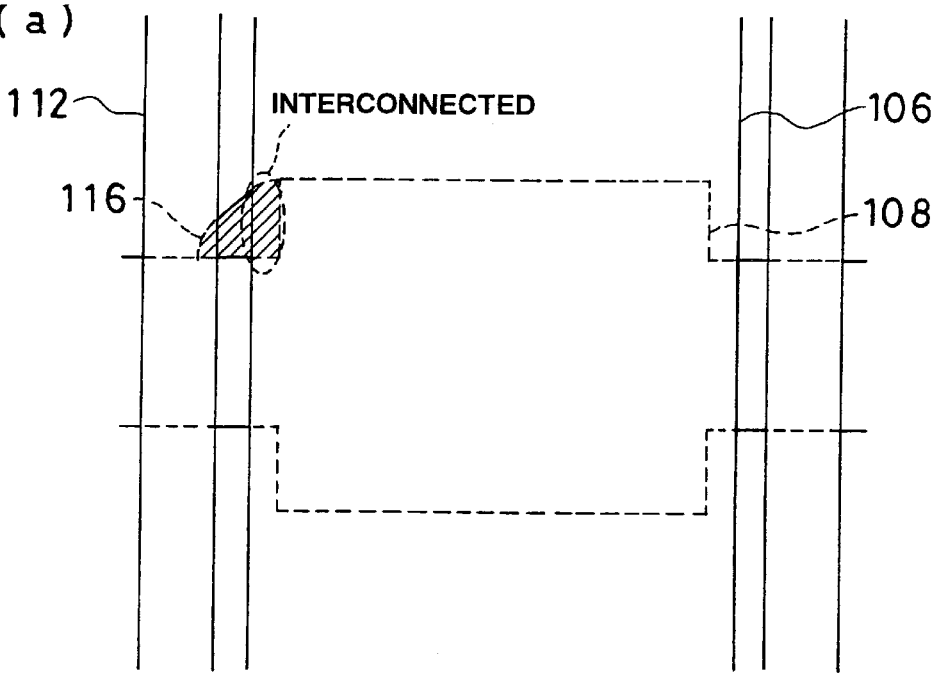
(b)
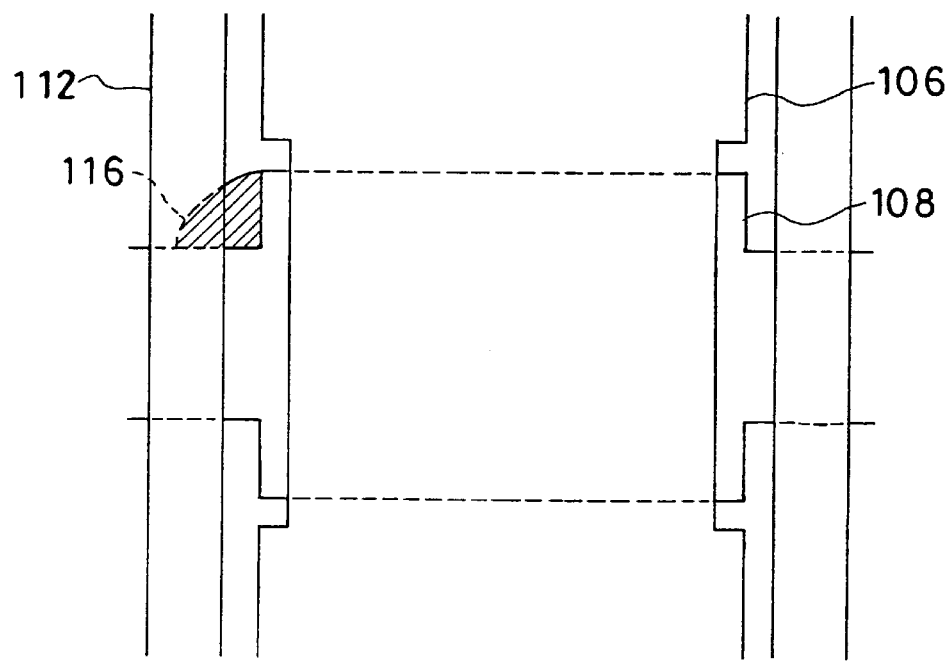
106 : PIXEL ELECTRODE  112 : DRAIN BUS LINE
108 : STORAGE CAPACITANCE ELECTRODE  116 : RESIDUAL a-Si 101 : GATE ELECTRODE
102 : CHANNEL LAYER
103 : DRAIN ELECTRODE
104 : SOURCE ELECTRODE
106 : PIXEL ELECTRODE
108 : STORAGE CAPACITANCE ELECTRODE
110 : THROUGH-HOLE
111 : GATE BUS LINE
112 : DRAIN BUS LINE 101 : GATE ELECTRODE
102 : CHANNEL LAYER
103 : DRAIN ELECTRODE
104 : SOURCE ELECTRODE
106 : PIXEL ELECTRODE
110 : THROUGH-HOLE
111 : GATE BUS LINE
112 : DRAIN BUS LINE

FIG. 26 PRIOR ART
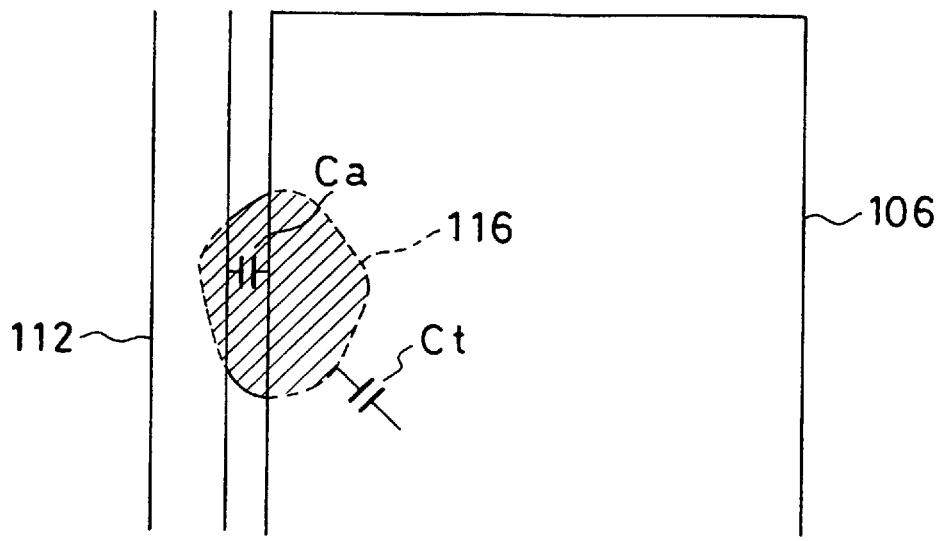
$$\Delta Vp = \frac{Ca}{Ct} \Delta VD \cdots \text{①}$$
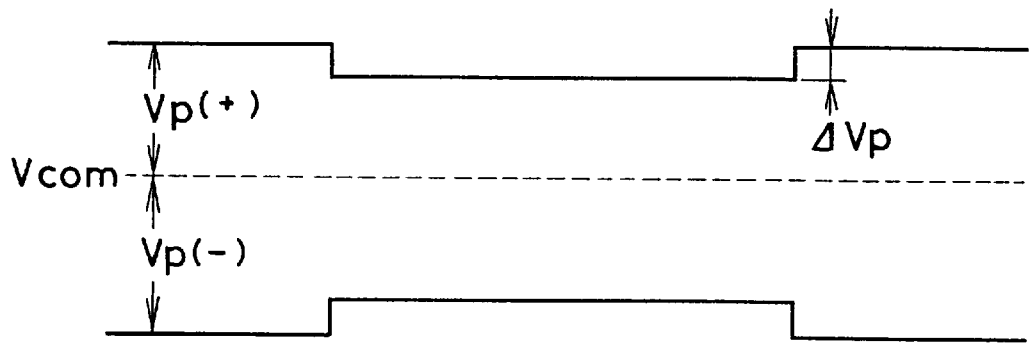
Ca : DRAIN-PIXEL PARACITIC CAPACITANCE
Ct : TOTAL CAPACITANCE OF PIXEL
$\Delta Vp$ : VOLTAGE MODULATION OF PIXEL
$\Delta VD$ : DRAIN AMPLITUDE
106 : PIXEL ELECTRODE
112 : DRAIN BUS LINE
116 : RESIDUAL a-Si

THIN-FILM TRANSISTOR ARRAY AND METHOD FOR MANUFACTURING SAME

TECHNICAL FIELD OF THE INVENTION

This invention relates to a thin-film transistor array and, more particularly, to a thin-film transistor array that can be used with advantage for an active matrix liquid crystal display panel.

DISCUSSION ON THE RELATED ART

The following specific analyses have been given on the related art by the inventors in the course of the investigation toward the present invention.

An active matrix type liquid crystal display device, employing a thin-film transistor ('TFT') as a switching device, is made up of a TFT substrate comprised of a matrix array of TFTs and pixel electrodes and an opposing substrate electrode, arranged opposing the TFT substrate with a liquid crystal material interposed in-between. The opposing substrate electrode includes a light-shielding film (so-called black matrix), a color filter and a common electrode.

FIG. 15 shows a plan view illustrating the structure for one pixel of a typical thin-film transistor array, and FIG. 16 shows a cross-sectional view taken along line G–G' of FIG. 15. This structure is referred to as 'a first conventional technique'.

Referring to FIGS. 15 and 16, the structure of the first conventional technique is explained.

The active matrix type liquid crystal display device, employing the TFT as an active device, has a structure in which a gate bus line 111, wired in the horizontal direction from a gate driver, and a drain bus line 112, wired in the vertical direction from a source driver, are connected to a gate electrode 101 and a drain electrode 103 of the TFT device, respectively, and in which a pixel electrode 106 is connected to a source electrode 104 of the TFT device.

When a given gate line 111 goes high, the TFTs connected to this gate bus line 111 are turned on in unison. The pixel electrode 106, connected to this TFT, is charged to a signal voltage applied to the drain bus line 112.

If then the gate bus line 111 goes low, the TFT in the on-state is turned off. However, the pixel electrode 106 keeps on to maintain its charging voltage. This maintained voltage is rewritten by the next signal voltage when the corresponding TFT again goes on.

If the active matrix type liquid crystal display device employing this TFT substrate is to make display of satisfactory quality, it is necessary for the pixel electrode 106 to hold the charging voltage sufficiently until next rewriting.

FIG. 17 shows a cross-sectional view illustrating, step-by-step, the process for manufacturing a typical thin-film transistor array (first conventional technique) shown in FIG. 16. Referring to FIG. 17, the manufacturing method according to the first conventional technique is explained.

A gate electrode 101 formed by a metal film of Cr or Al is patterned on a glass substrate 100, as shown in FIG. 17a. A gate insulating film 114, a channel layer 102 of intrinsic semiconductor amorphous silicon 'a-Si(n+)' and a contact layer 107 of n+ semiconductor amorphous silicon ('a-Si (n+)' are formed sequentially thereon.

The semiconductor layer is then etched (FIG. 17b) and the gate insulating film 114 of the contact area interconnecting the gate layer and the drain layer are removed by patterning, so that a through-hole, not shown, is formed for interconnecting a metal film forming the gate electrode 101 and a metal film forming the drain electrode 103, source electrode 104 and the drain bus line 112.

Similarly to the drain electrode 101, the gate electrode 103, source electrode 104, drain bus line 112 and the pixel electrode 106 are formed (see FIGS. 17c and 17d) and subsequently a passivation film 115 is formed to complete a TFT array substrate (see FIG. 17e).

Meanwhile, a storage capacitance electrode 108 is formed simultaneously with the gate electrode 101 in the course of the patterning step for forming the gate electrode 101. The storage capacitance electrode 108 faces the pixel electrode 106 via the gate insulating film 114 operating as a storage capacitance insulating film in-between to constitute a storage capacitance.

The opposing substrate side is manufactured by forming a counter-electrode on a glass substrate, not shown.

Finally, orientation films, not shown, are formed on the TFT array substrates and the opposing substrate, by way of orientation processing, after which a sealing pattern is formed and the substrates are then stacked together and fired. Into the fired product is injected a liquid crystal, not shown, and the injection inlet is sealed to complete a liquid crystal panel.

To this liquid crystal panel are added a light polarization plate, a driving circuit and a casing to complete a liquid crystal display device.

FIG. 18 shows a plan view illustrating the structure of one pixel of a representative thin-film transistor array characterized in that the storage capacitance is formed between it and the gate electrode (this structure is referred to as a 'second conventional technique). The number of patterning steps and the manufacturing method in this structure are the same as those of the first conventional technique explained in accordance with FIG. 17.

In the TFT of the structure shown in the first conventional technique and in the second conventional technique, the drain bus line 112 and the pixel electrode 106 are both electrically conductive layers each extending over the gate insulating film 114, and are spaced apart from each other by a pre-set distance. However, if residual patterning troubles would occur in any patterning process, shorting is likely to occur between the drain bus line 112 and the pixel electrode 106.

If shorting occurs between the drain bus line 112 and the pixel electrode, charging/discharging of the pixel electrode 106 cannot be controlled by on/off control of the TFT such that the pixels become visible as bright-point defect.

For reducing this shorting, there has been proposed in, for example, JP Patent Kokai JP-A-7-325314 a liquid crystal device in which, as shown in FIG. 19a, by a step difference of the storage capacitance electrode 108, the pixel electrode 106 in the vicinity of the storage capacitance electrode 108 is constricted or retracted, as shown in FIG. 19b, relative to residual a-Si 116, so that the drain bus line 112 and the pixel electrode 106 become difficult to get conductive by the residual a-Si 116. The structure, however, cannot be applied to other than the case of residual a-Si attributable to the step difference of the storage capacitance electrode 108.

There has also been proposed a TFT structure in which the drain bus line 112 and the pixel electrode 106 are laminated via an insulating film interposed in-between for reducing occurrences of shorting. FIG. 20 shows, in a plan view, the structure for one pixel of a TFT array aimed at reducing the shorting between the drain bus line 112 and the pixel electrode 106. FIG. 21 is a cross-sectional view taken along line H–H' in FIG. 20 (third conventional technique).

Referring to FIGS. 20 and 21, the structure of the third conventional technique is explained.

In this third conventional technique, the drain bus line 112 is provided on the gate insulating film 114, whilst the pixel electrode 106 is formed on a passivation film 115. The drain bus line 112 and the pixel electrode 106 are separated on the layer basis by the passivation film 115.

FIG. 22 is a process diagram showing, step-by-step, the manufacturing process for a thin-film transistor array (third conventional technique) aimed at reducing shorting between the drain bus line 112 and the pixel electrode 106 as shown in FIG. 21. Referring to FIG. 22, the manufacturing method for this third conventional technique is explained.

On the glass substrate 100 was patterned a gate electrode 101 of a metal film, such as Cr or Al (see FIG. 22a), after which the gate insulating film 114 and the channel layer 102 formed of a-Si(I) and a contact layer 107 formed of a-Si(n$^+$) are formed sequentially.

The semiconductor layer is then etched (see FIG. 22b) and a patterning step of removing the gate insulating film 114 of the contact area interconnecting the gate layer and the drain layer is then carried for forming a through-hole, not shown, for interconnecting the metal film forming the gate electrode 101 and the metal film forming the source electrode 104 and the drain bus line 112.

Then, similarly to the gate electrode 101, the drain electrode 103 formed by a metal layer, such as Cr or Al, source electrode 104 and the drain bus line 112 are formed, as shown in FIG. 22c.

The passivation film 115 is then formed thereon and the through-hole 110 interconnecting the source electrode 104 and the pixel electrode 106 is provided (FIG. 22d). The pixel electrode 106 is then formed to provide a TFT array substrate (FIG. 22e).

In this structure, the storage capacitance electrode 108 is formed simultaneously with the gate electrode 101 by the patterning process forming the gate electrode 101. The number of the patterning steps is equal to that used in the first conventional technique.

Another conventional technique characterized in that occurrences of shorting between the drain bus line 112 and the pixel electrode 106 is reduced and the storage capacitance electrode serves simultaneously as the gate electrode (referred to as a 'fourth conventional technique'), as in the third conventional technique, is shown as a plan view in FIG. 23. FIG. 9 shows a cross-section taken along line D–D' in FIG. 23. The number of the patterning steps is equal to that used in the third conventional technique (see FIG. 22).

For explaining the effect of the third and fourth conventional techniques, FIG. 24 shows, in a plan view, the state of generation of a-Si residuals on a pixel. FIG. 25 shows a cross-sectional view taken along line I–I' in FIG. 24.

In the above-mentioned conventional technique, since the drain bus line 112 and the pixel electrode 106 are separated on the layer basis by the passivation film 115, no shorting occurs between the drain bus line 112 and the pixel electrode 106 even on occurrence of patterning defects in the course of the respective patterning steps. This reduces occurrences of point defects, that is bright and dark points.

However, even with this structure in which the drain bus line 112 and the pixel electrode 106 are separated form each other on the layer basis, electrically conductive foreign substances, such as a-Si, are left on occurrence of patterning defects, as shown in FIG. 26. Moreover, parasitic capacitances Ca between the drain bus line 112 contacted with the pixel electrode 106 and the pixel electrode 106 are increased. If there exist parasitic capacitances between the drain bus line 112 and the pixel electrode 106, the maintained voltage of the pixel Vp is modulated ($\Delta$Vp) as shown by the following equation (1):

$$\Delta V_P = (C_a/C_t)\Delta V_D \tag{1}$$

where Ca: drain-to-pixel capacitance

Ct: total capacitance of the pixel $\Delta$Vp: voltage modulation of a pixel $\Delta$V$_D$: drain amplitude If the drain-to-pixel capacitance Ca is increased by the interposed electrically conductive foreign substances, the pixel voltage is lowered by 2×$\Delta$Vp as compared to that for regular pixels, so that point defects of semi-bright spots tend to be increased.

SUMMARY OF THE DISCLOSURE

In the structure of the above-described third and fourth conventional techniques, in which, for suppressing shorting between the drain bus line and the pixel electrode, the drain bus line and the pixel electrode are separated on the layer basis by an insulating film, the residual a-Si, if produced as shown in FIGS. 24 and 25, leads to such an inconvenience that, since the residual a-Si is electrically connected to the drain bus line 112, the parasitic capacitance between the drain bus line 112 and the pixel electrode 106 is increased to increase point defects of semi-bright spots, that is points that have no optimum brightness.

It is therefore an object of the present invention to provide a transistor array in which occurrences of point defects of bright and dark spots ascribable to shorting between the drain bus line and the pixel electrode may be reduced.

It is a further object of the present invention to provide a transistor array in which a residual a-Si produced by patterning defects may be removed without increasing the number of patterning steps.

It is a still further object of the present invention to provide a transistor array in which the occurrences of point defects of bright and dark spots ascribable to increased parasitic capacitance between the drain bus line and the pixel electrode caused by electrical connection of residual a-Si to the drain bus line in order to reduce production loss and in order to improve yield and product quality.

Other objects of the present invention will become apparent in the entire disclosure.

According to one aspect of the present invention there is provided a thin-film transistor array comprising a matrix array of thin-film transistors, each made up of a gate electrode, a gate insulating film, a channel layer, a contact layer, a drain electrode, a source electrode and a passivation film on a transparent glass substrate, and pixel electrodes disposed on the passivation film and which are electrically connected with the source electrode via an opening portion of the passivation film, and a storage capacitance electrode provided on the same layer as the gate electrode opposing each pixel electrode. The improvement resides in that an insulating film for the pixel electrode, comprised of the gate insulating film and the passivation film and interposed between the pixel electrode of each pixel and the glass substrate, is formed only by the passivation film in at least a partial area.

The present invention provides a second aspect of thin-film transistor array comprising a matrix array of thin-film transistors, each made up of a gate electrode, a gate insulating film, a channel layer, a contact layer, a drain electrode, a source electrode and a passivation film on a transparent glass substrate, and pixel electrodes disposed on the passivation film and electrically connected with the source electrode via an opening portion in the passivation film, and a storage capacitance provided between each pixel electrode and the gate bus line of the previous stage. The improvement resides in that an insulating film for the pixel electrode, comprised of the gate insulating film and the passivation film and interposed between the pixel electrode of each pixel and the glass substrate, is formed only by the passivation film in at least a partial area.

The present invention provides a third aspect of thin-film transistor array in which an insulating film for the pixel electrode is formed only by the passivation film in a slit area extending along the side of the pixel electrode.

The present invention provides a fourth aspect of thin-film transistor array comprising a matrix array of: thin-film transistors, each made up of a gate electrode, a gate insulating film, a channel layer, a contact layer, a drain electrode, a source electrode and a passivation film on a transparent glass substrate, and pixel electrodes disposed on the passivation film and electrically connected with the source electrode via an opening portion of the passivation film, and a storage capacitance electrode provided on the same layer as the gate electrode for opposing each pixel electrode. The improvement resides in that an insulating film for the pixel electrode, comprised of the gate insulating film and the passivation film and interposed between the pixel electrode of each pixel and the glass substrate, is formed only by the gate insulating film in at least a partial area.

The present invention provides a fifth aspect of thin-film transistor array comprising a matrix array of thin-film transistors, each made up of a gate electrode, a gate insulating film, a channel layer, a contact layer, a drain electrode, a source electrode and a passivation film on a transparent glass substrate; and pixel electrodes arranged on the passivation film and electrically connected with the source electrode via an opening portion in the passivation film, and a storage capacitance provided between each pixel electrode and the gate bus line of the previous stage. The improvement resides in that an insulating film for the pixel electrode, comprised of the gate insulating film and the passivation film and interposed between the pixel electrode of each pixel and the glass substrate, is formed only by the gate insulating film in at least a partial area.

The present invention provides a sixth aspect of the thin-film transistor array according to the fourth and fifth aspects in which the insulating film for the pixel electrode is formed only by the gate insulating film in a slit area extending along the side of the pixel electrode.

Also, for accomplishing the above object, the present invention provides, as a seventh aspect, a first method for manufacturing a thin-film transistor array comprising patterning a gate electrode and a storage capacitance electrode on a transparent glass substrate, sequentially forming a gate insulating film, a channel layer formed of an amorphous silicon of an intrinsic semiconductor and a contact layer of amorphous silicon of a n-type semiconductor. The method further comprises: patterning the amorphous silicon layer to the shape of an island, forming in the gate insulating film a through-hole serving for interconnecting a metal film forming the gate electrode and a metal film forming a drain electrode, a source electrode and a video signal line, and forming the drain electrode and the source electrode. The method further comprises: providing a passivation film and forming in the passivation film a through-hole for interconnecting the pixel electrode and the source electrode, and forming thereon the pixel electrode so as to interconnect to the source electrode.

In this method, the gate insulating film of at least a partial area of the insulating film for the pixel electrode, interposed between the pixel electrode of each pixel and the glass substrate and made up of the gate insulating film and the passivation film, is removed by the same patterning process as the patterning process used for forming the through-hole serving for interconnecting the metal film forming the gate electrode and the metal film forming the drain electrode, source electrode and the video signal line.

As a eight aspect, the present invention also provides a second method for manufacturing a thin-film transistor array comprising: patterning a gate electrode and a storage capacitance electrode on a transparent glass substrate, and sequentially forming a gate insulating film, a channel layer formed of an amorphous silicon of an intrinsic semiconductor and a contact layer of amorphous silicon of a n-type semiconductor. The method further comprises: patterning the amorphous silicon layer to the shape of an island, forming in the gate insulating film a through-hole serving for interconnecting a metal film forming the gate electrode and a metal film forming a drain electrode, a source electrode and a video signal line, and forming the drain electrode and the source electrode. The method further comprises providing a passivation film and forming in the passivation film a through-hole for interconnecting the pixel electrode, and the source electrode and forming thereon the pixel electrode so as to interconnect to the source electrode.

In this method, the passivation film of at least a partial area of the insulating film for the pixel electrode, interposed between the pixel electrode of each pixel and the glass substrate and which is made up of the gate insulating film and the passivation film, is removed by the same patterning process as the patterning process used for forming a through-hole adapted for interconnecting the pixel electrode and the source electrode.

According to the present invention, residual a-Si overlapped between the drain bus line or the gate bus line and the pixel electrode can be removed simultaneously by etching off the gate insulating film which is interposed between the transparent glass substrate and the pixel electrode, thus suppressing the reject ratio of point defects to improve the product yield. The gate insulating film has conventionally served as an insulating film for the pixel electrode.

According to further aspects of the present invention, the capacitive interconnection between the pixel electrodes and neighboring bus lines (e.g., gate bus lines and/or drain bus lines) by providing a boundary separating layer portion and/or slit portion which interrupts or breaks the capacitive coupling which might result from defective patterning, e.g., residual a-Si layer left at the boundary area between the pixel electrodes and neighboring bus lines. The slit portion may be filled with an insulating layer material, e.g., a passivation film or a gate insulating layer material.

In a ninth aspect there is provided a display device having gate bus lines, drain bus lines, and a thin-film transistor array disposed on a transparent substrate, the thin-film transistor array comprising a matrix array of: thin-film transistors, each made up of a gate electrode, a gate insulating film, a channel layer, a drain electrode, a source electrode and a passivation film on the substrate, and pixel electrodes disposed on the passivation film and electrically connected with the source electrode, with a storage capacitance electrode being provided the substrate opposing each pixel electrode, wherein an insulating film for the pixel electrode, comprised of the gate insulating film and the passivation film and interposed between the pixel electrode of each pixel and the substrate, is formed only by the passivation film in at least a partial area neighboring the gate bus lines and/or drain bus lines.

In a tenth aspect, there is provided a display device having gate bus lines, drain bus lines and a thin-film transistor array disposed on a transparent substrate, the thin-film transistor array comprising a matrix array of: thin-film transistors, each made up of a gate electrode, a gate insulating film, a channel layer, a drain electrode, a source electrode and a passivation film on the substrate, and pixel electrodes disposed on the passivation film and electrically connected with the source electrode, with a storage capacitance being provided between each pixel electrode and the gate bus line of the previous stage, wherein an insulating film for the pixel electrode, comprised of the gate insulating film and the passivation film and interposed between the pixel electrode of each pixel and the glass substrate, is formed only by the passivation film in at least a partial area neighboring the gate bus lines and/or drain bus lines.

In an eleventh aspect, there is provided a display device having gate bus lines, drain bus lines and a thin-film transistor array disposed on a transparent substrate, the thin-film transistor array comprising a matrix array of: thin-film transistors, each made up of a gate electrode, a gate insulating film, a channel layer, a contact layer, a drain electrode, a source electrode and a passivation film on a transparent substrate, and pixel electrodes disposed on the passivation film and electrically connected with the source electrode via an opening portion of the passivation film, with a storage capacitance electrode being provided on the same layer as the gate electrode opposing each pixel electrode, wherein an insulating film for the pixel electrode, comprised of the gate insulating film and the passivation film and interposed between the pixel electrode of each pixel and the substrate, is formed only by the gate insulating film in at least a partial area neighboring the gate bus lines and/or drain bus lines.

In a twelfth aspect, there is provided a display device having gate bus lines, drain bus lines and a thin-film transistor array disposed on a transparent substrate, the thin-film transistor array comprising a matrix array of: thin-film transistors, each made up of a gate electrode, a gate insulating film, a channel layer, a drain electrode, a source electrode and a passivation film on the substrate, and pixel electrodes disposed on the passivation film and electrically connected with the source electrode, with a storage capacitance being provided between each pixel electrode and the gate bus line of the previous stage, wherein an insulating film for the pixel electrode, comprised of the gate insulating film and the passivation film and interposed between the pixel electrode of each pixel and the substrate, is formed only by the gate insulating film in at least a partial area neighboring the gate bus lines and/or drain bus lines.

BRIEF DESCRIPTION OF THE DRAWINGS

FIG. 19 illustrates a structure of JP Patent Kokai JP-A-7-325314.

FIG. 26 illustrates the principle of generation of semibright spots by residual a-Si.

PREFERRED EMBODIMENTS OF THE INVENTION

Figure 1:
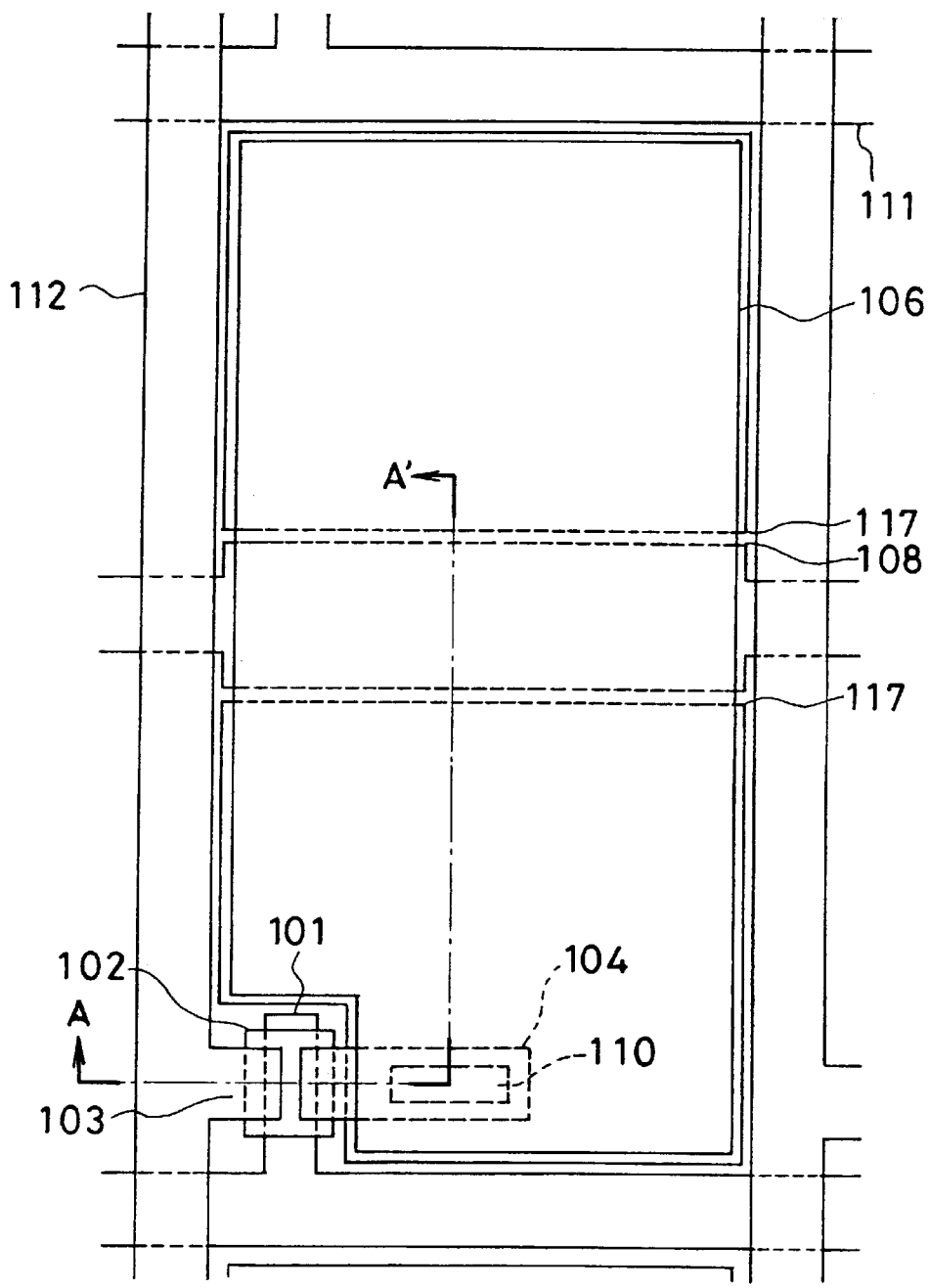
FIG. 1 is a plan view of a thin-film transistor array according to a first embodiment of the present invention.

Preferred embodiments of the present invention are hereinafter explained.

In its preferred form, a first thin-film transistor array of the present invention includes a matrix array of inverted staggered a-Si thin-film transistors, constituted by a gate electrode, a gate insulating film, a channel layer, a contact layer, a drain electrode, a source electrode and a passivation film on a transparent glass substrate, and pixel electrodes arranged on the passivation film and electrically connected with the source electrode via an opening portion of the passivation film. A storage capacitance electrode is provided on the same layer as the gate electrode for facing each pixel electrode. An insulating film for the pixel electrode, which is comprised of the gate insulating film (114 of FIG. 2) and the passivation film (115 of FIG. 2) and which is interposed between the pixel electrode of each pixel and the glass substrate, is formed only by the passivation film (115 of FIG. 2) in at least a part of the entire area.

In its preferred form, a first thin-film transistor array of the present invention includes a matrix array of thin-film transistors, constituted by a gate electrode, a gate insulating film, a channel layer, a contact layer, a drain electrode, a source electrode and a passivation film on a transparent glass substrate, and pixel electrodes arranged on the passivation film and which are electrically connected with the source electrode via an opening portion in the passivation film. A storage capacitance electrode is provided between each pixel electrode (106 of FIG. 6). and the gate bus line of the previous stage (111 of FIG. 6). An insulating film for the pixel electrode, which is comprised of the gate insulating film and the passivation film and which is interposed between the pixel electrode of each pixel and the glass substrate, is formed only by the passivation film in at least a part of the entire area (see FIG. 7).

In its preferred from, a third thin-film transistor array of the present invention is an embodiment of the first and second thin-film transistor arrays in which the insulating film for the pixel electrode is formed only by the passivation film in a slit area (117 in FIG. 8) extending along a side of the pixel electrode neighboring the drain bus line.

In its preferred form, a fourth thin-film transistor array of the present invention includes a matrix array of thin-film transistors, constituted by a gate electrode, a gate insulating film, a channel layer, a contact layer, a drain electrode, a source electrode and a passivation film on a transparent glass substrate, and pixel electrodes, arranged on the passivation film and electrically connected with the source electrode via an opening portion in the passivation film. A storage capacitance electrode is provided on the same layer as the gate electrode for facing each pixel electrode. An insulating film for the pixel electrode, comprised of the gate insulating film and the passivation film and interposed between the pixel electrode of each pixel and the glass substrate, is formed only by the gate insulation film in at least a partial area (see FIG. 13).

In its preferred form, a fifth thin-film transistor array of the present invention includes a matrix array of thin-film transistors, constituted by a gate electrode, a gate insulating film, a channel layer, a contact layer, a drain electrode, a source electrode and a passivation film on a transparent glass substrate, and pixel electrodes arranged on the passivation film and which are electrically connected with the source electrode via an opening portion of the passivation film. A storage capacitance electrode is provided between each pixel electrode and the gate bus line of the former stage. An insulating film for the pixel electrode, comprised of the gate insulating film and the passivation film and interposed between the pixel electrode of each pixel and the glass substrate, may be formed only by the gate insulation film in at least a partial area.

In its preferred from, a sixth thin-film transistor array of the present invention is an embodiment in the fourth and fifth thin-film transistor arrays in which the insulating film for the pixel electrode is formed only by the gate insulation film in a slit area extending along a side of the pixel electrode neighboring the drain bus line.

A first manufacturing method according to the present invention comprises the steps of:

(a) patterning a gate electrode and a storage capacitance electrode on a transparent glass substrate (see FIG. 3a);

(b) sequentially forming a gate insulating film, a channel layer formed of an amorphous silicon of intrinsic semiconductor and a contact layer of amorphous silicon of n-type semiconductor and patterning the amorphous silicon layer to the shape of an island (see FIG. 3b);

(c) forming in the gate insulating film a through-hole serving for interconnecting a metal film forming the gate electrode and a metal film forming a drain electrode, a source electrode and a video signal line (see FIG. 3c);

(d) forming a drain electrode and a source electrode (see FIG. 3d);

(e) providing a passivation film and forming in the passivation film a through-hole for interconnecting the pixel electrode and the source electrode (see FIG. 3e); and (f) forming thereon a pixel electrode for interconnection to the source electrode (see FIG. 3f);

In above steps, the gate insulating film of at least a partial area of the insulating film for the pixel electrode which is interposed between the pixel electrode of each pixel and the glass substrate and which is made up of the gate insulating film and the passivation film, is removed by the same patterning process as the patterning process for forming the through-hole used for interconnecting the metal film forming the gate electrode and the metal film forming the drain electrode, source electrode and the video signal line.

A second manufacturing method according to the present invention includes the steps of:

(a) patterning a gate electrode and a storage capacitance electrode on a transparent glass substrate (see FIG. 14a);

(b) sequentially forming a gate insulating film, a channel layer formed of an amorphous silicon of intrinsic semiconductor and a contact layer of amorphous silicon of n-type semiconductor and patterning the amorphous silicon layer to the shape of an island (see FIG. 14b);

(c) forming in the gate insulating film a through-hole serving for interconnecting a metal film forming the gate electrode and a metal film forming a drain electrode, a source electrode and a video signal line and subsequently forming the drain electrode and the source electrode (see FIG. 14c);

(d) forming a passivation film (see FIG. 14d);

(e) forming in the passivation film a through-hole for interconnecting a pixel electrode and the source electrode (see FIG. 14e); and (f) forming thereon a pixel electrode for interconnection to the source electrode (see FIG. 14f);

In the above steps, the passivation film of at least a partial area of the insulating film for the pixel electrode, which is interposed between the pixel electrode of each pixel and the glass substrate and which is made up of the gate insulating film and the passivation film, is removed by the same patterning process as the patterning process used for forming the through-hole serving for interconnecting the pixel electrode and the source electrode.

DETAILED DESCRIPTION OF THE PREFERRED EMBODIMENTS

Referring to the drawings, preferred embodiments of the present invention will be explained in detail.

Embodiment 1

Figure 2:
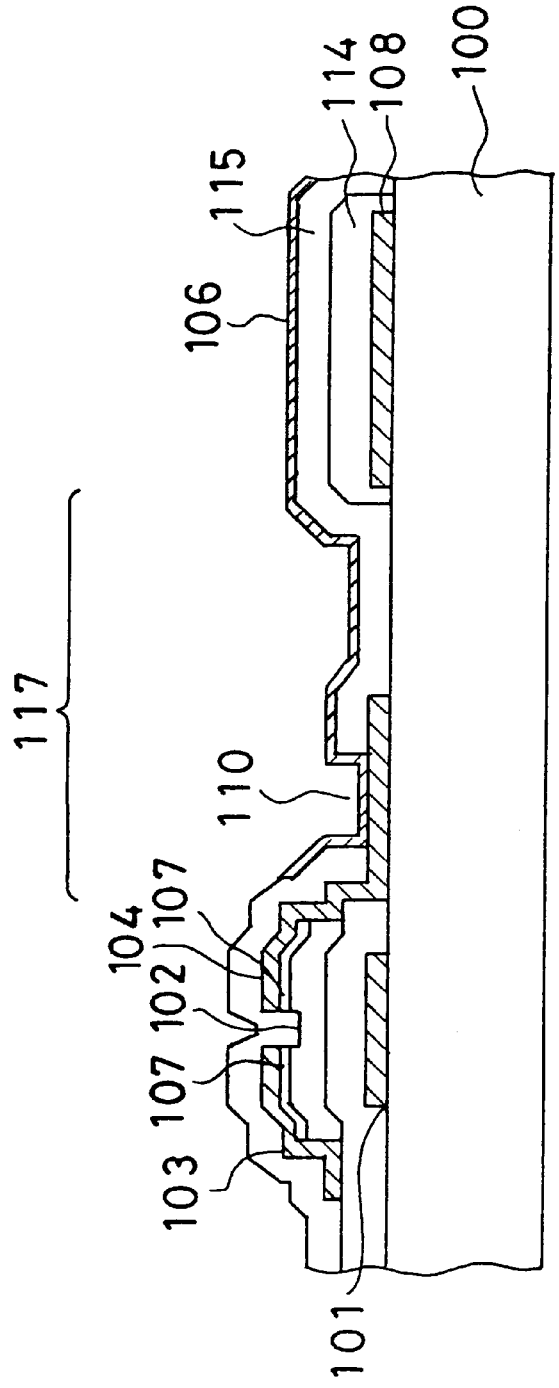
FIG. 2 is a cross-sectional view taken along line A–A' of FIG. 1.

FIG. 1 and 2 show a plan view illustrating a first embodiment of a thin-film transistor array of the present invention and a cross-sectional view taken along line A–A' of FIG. 1, respectively.

Referring to FIGS. 1 and 2, the structure of the first embodiment of the present invention is explained.

In the first embodiment of the present invention, there exist two layers, namely a gate insulating film 114 and a passivation film 115 as upper layers of the gate electrode 101 and the gate bus line 111. However, the insulating film for the pixel electrode disposed below the pixel electrode 106 is made up only of the passivation film 115. Namely 117 termed as "removing pattern" designates an area where the gate insulating film 114 has been removed.

The passivation film 115, as an insulating film, is interposed between a drain bus line 112 and the pixel electrode 106. Namely, the drain bus line 112 is disposed below the passivation film 115, whereas the pixel electrode 106 is above the passivation film.

Figure 3:
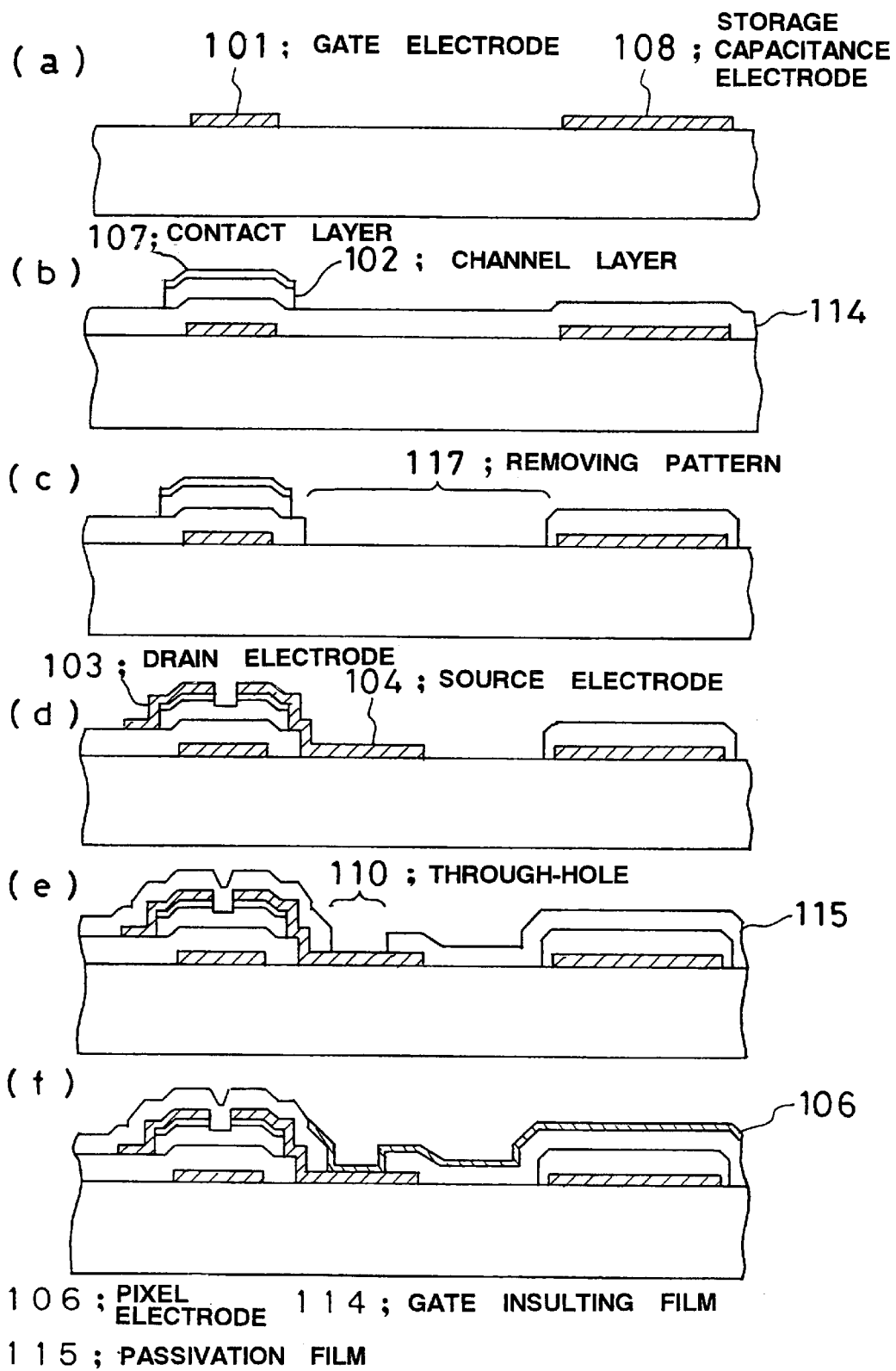
FIG. 3 is a cross-sectional view showing the manufacturing process of a thin-film transistor array according to the first embodiment of the present invention.

FIG. 3 shows a cross-sectional view for illustrating, step-by-step, the manufacturing process for manufacturing a thin-film transistor array of a first. embodiment of the present invention. Referring to FIG. 3, the manufacturing method for the first embodiment of the present invention is explained.

The gate bus line 111 formed by a metal film of metals, such as Cr or Al, and the gate electrode 101, are patterned on a glass substrate 100, at the same time as a storage capacitance electrode 108 is formed thereon by the same patterning process (see FIG. 3a).

After sequentially forming the gate insulating film 114, channel layer 102 formed of a-Si(I) and a contact layer 107 formed of a-Si(n$^+$), the semiconductor layer is etched (see FIG. 3b) for removing the gate insulating film 114 of the contact area interconnecting the gate layer and the drain layer for forming a through-hole (not shown) used for interconnecting a metal film forming the gate bus line 101 and a metal film forming the drain electrode 103, source electrode 104 and the drain bus line 112 by way of patterning. During this patterning process, the gate insulating film 114 of an area 117 lying below the pixel electrode of each unit pixel is simultaneously removed so as not to stride on the gate bus line 101 and the storage capacitance electrode 108 (see FIG. 3c).

In the above process, if there is any residual pattern of the gate metal, this residual metal pattern can be removed by immersion in the etching solution of the gate metal after etching the gate insulating film 114. This simultaneously prevents increase in the parasitic capacitance or shorting.

Then, similarly to the gate bus line 101, the drain electrode 103 formed by a metal film, such as Cr or Al film, source electrode 104 and the drain bus line 112 are formed (see FIG. 3d).

The passivation film 115 then is formed and a through-hole 110 for interconnecting the source electrode 104 and the pixel electrode 106 is formed (see FIG. 3e).

The pixel electrode 106 is formed for interconnection to the source electrode 104 to give a TFT array substrate (see FIG. 3f).

As for a counter-substrate, a black matrix layer, not shown, formed by a metal film, such as a Cr film, is provided on a glass substrate, not shown, and a counter-electrode, not shown, is formed thereon.

Finally, an orientation film (not shown) is formed on each of the TFT array substrate and the counter-substrate and subjected to orientation processing. After forming a seal pattern, the two substrates are stacked and fired. The liquid crystal is then injected and sealed to complete a liquid crystal display panel.

Figure 4:
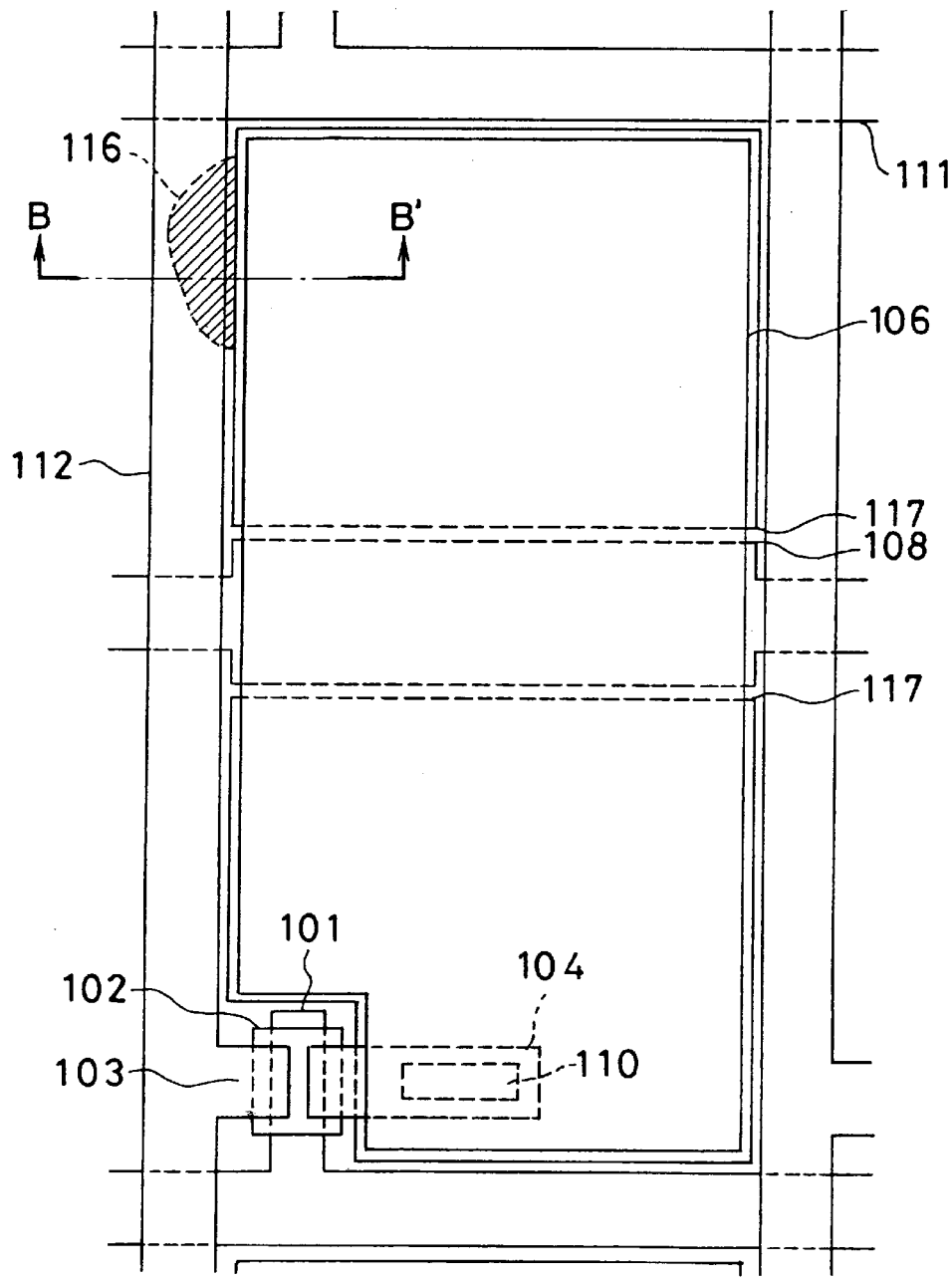
FIG. 4 is a plan view showing a thin-film transistor array according to the first embodiment of the present invention and particularly showing the state of occurrence of residual a-Si.
Figure 5:
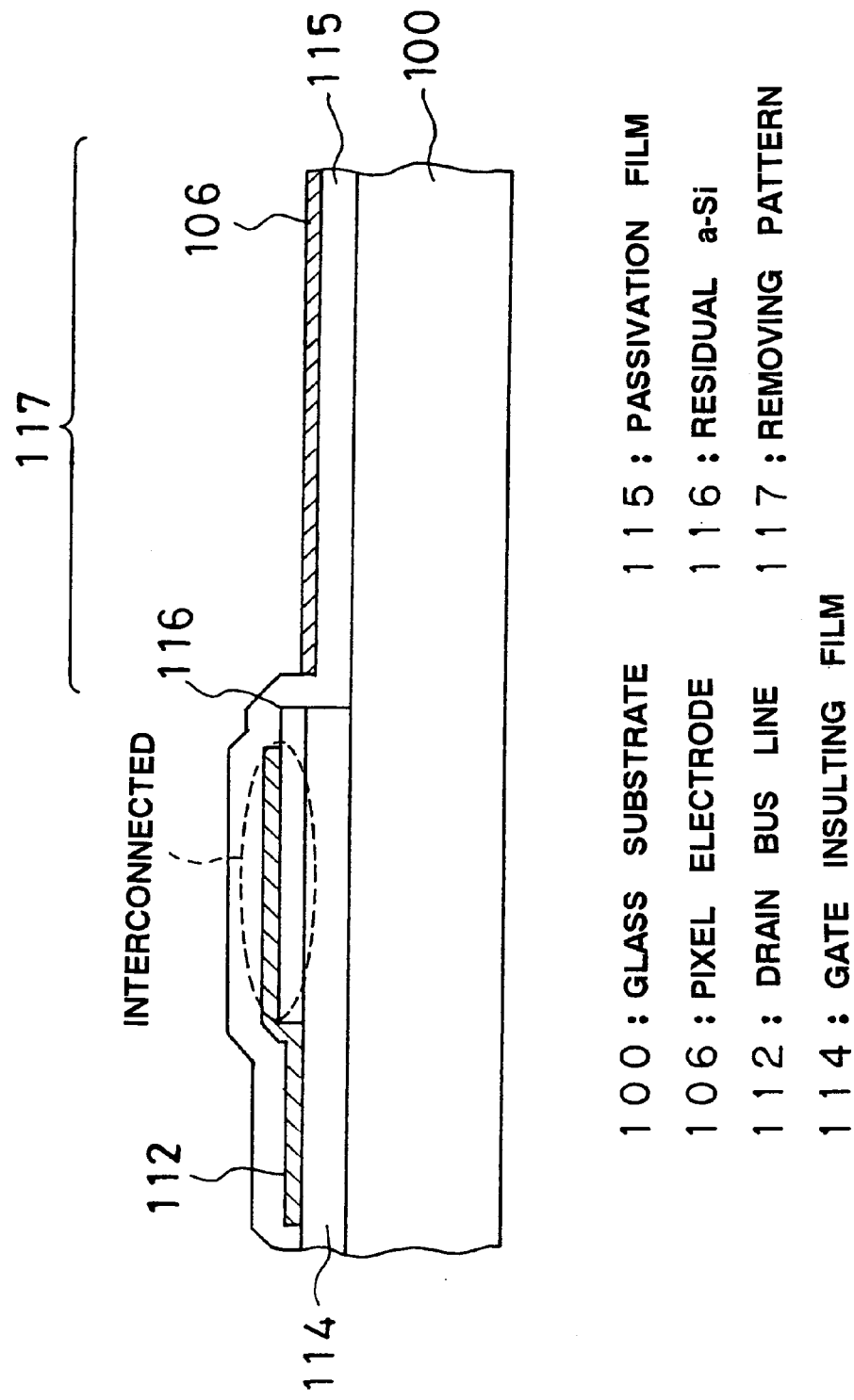
FIG. 5 is a cross-sectional view taken along line B–B' of FIG. 4.

By way of illustrating the operation and effect of the first embodiment of the present invention, FIGS. 4 and 5 show a plan view illustrating residual-Si produced on a pixel and a cross-sectional view taken along line B–B' of FIG. 4.

In the first embodiment of the present invention, the gate insulating film 114 of the area 117 lying below the pixel electrode can be removed by the contact step and simultaneously removing residual a-Si 116 produced by defective patterning during the island process as shown in the plan view of FIG. 4 and in the cross-sectional view of FIG. 5. Thus, as shown in FIG. 5, the passivation film 115 extends at the end of the pixel electrode 106 from its lower side to the upper side to form a boundary layer, and further extends to the upper side of the drain bus line 112.

This reduces occurrence of point defects of semi-bright spots caused by interconnection of the pixel electrode 106 to the drain bus line 112 and the resultantly increased parasitic capacitance between the drain bus line and the pixel electrode 106 to suppress the reject ratio as well as to increase production yield.

Also, in the first embodiment of the present invention, since the gate insulating film 114 of the area 117 lying below the pixel electrode is etched off using the patterning step which is the same as that used for producing the through-hole serving for interconnecting the metal film forming the gate bus line 101 and the metal film forming the source electrode 104 and the drain bus line 112, the number of the patterning steps is the same as that of the conventional manufacturing method, thus avoiding complication of the manufacturing process.

Also, in the first embodiment of the present invention, a thin residual layer 116, if any, of the gate metal resulting from patterning can be removed to a certain extent by immersion of the gate metal etching liquid after etching the gate insulating film for a short time such as not to cause significant etching of the lower layer of the gate interconnection.

Moreover, since there is insulating the passivation film 115 as a boundary separating film between the drain bus line 112 and the pixel electrode 106, the structure for reducing the occurrences of the point defects, such as bright or dark spots, ascribable to shorting between the drain bus line 112 and the pixel electrode 106, is realized. In addition, since the drain bus line 112 and the pixel electrode 106 are formed in separate layers, the pixel electrode 106 can be increased in area, thus simultaneously increasing the opening ratio.

Figure 6:
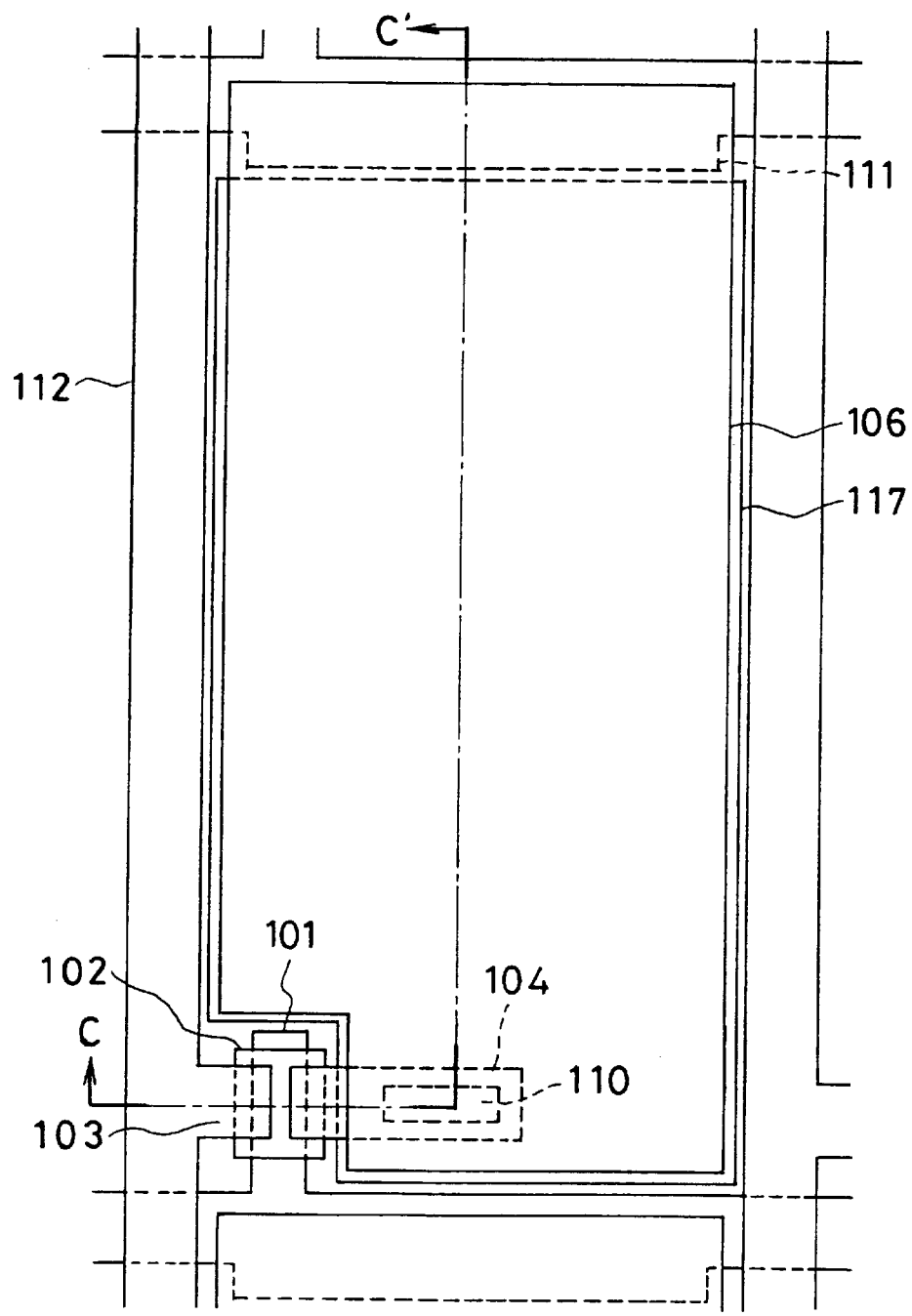
FIG. 6 is a plan view of a thin-film transistor array according to a second embodiment of the present invention.
Figure 7:
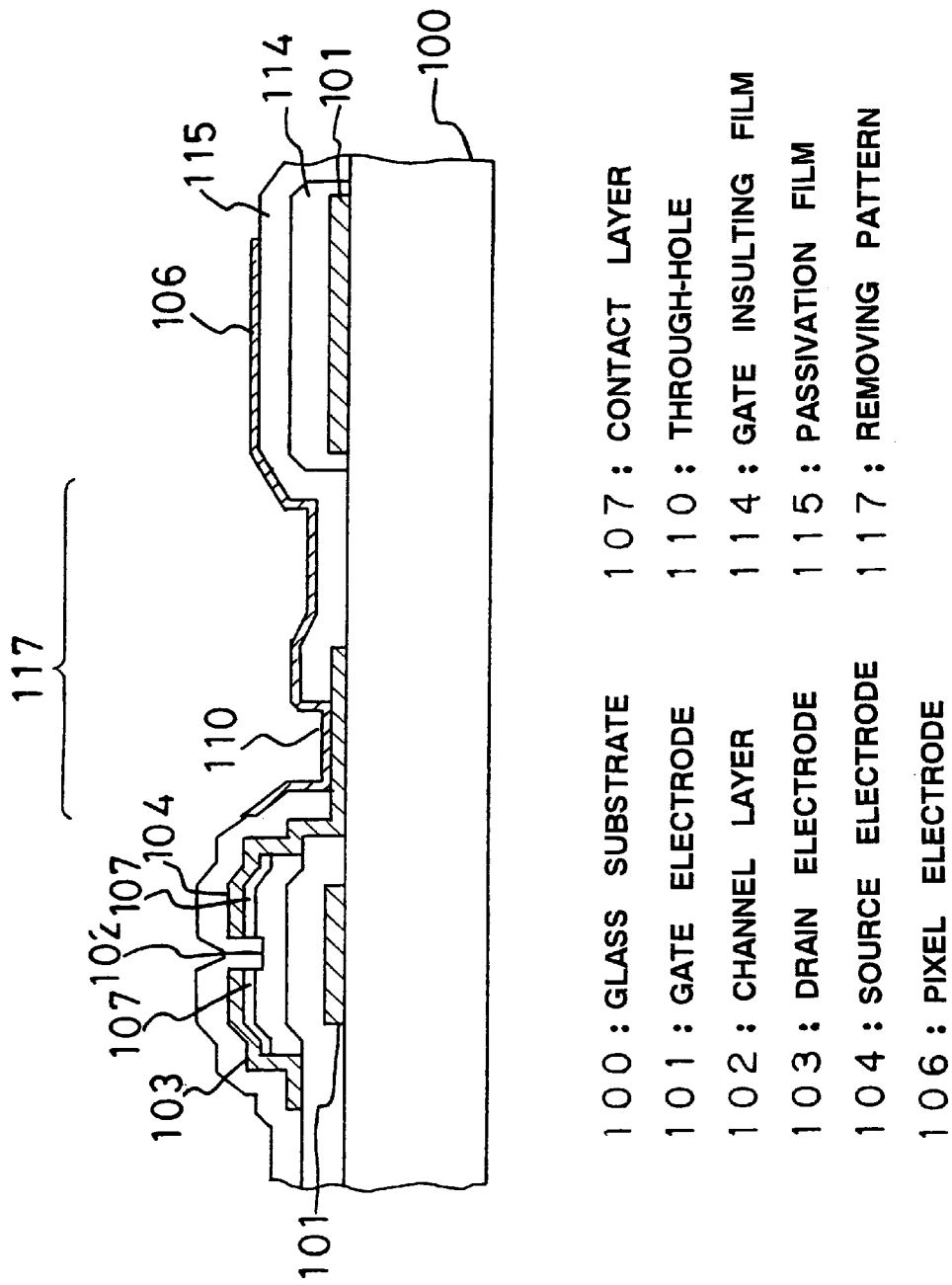
FIG. 7 is a cross-sectional view taken along line C–C' of FIG. 6.

FIG. 6 shows a plan view illustrating the structure of the second embodiment of the thin-film transistor array of the present invention and FIG. 7 is a cross-sectional view taken along line C–C' of FIG. 6.

Referring to FIGS. 6 and 7, the structure and the manufacturing method of the second embodiment of the present invention are explained.

The second embodiment of the present invention is characterized in that the storage capacitance electrode 108 is used simultaneously as the gate bus line 101 and is otherwise the same as the above-described first embodiment.

In the second embodiment of the present invention, the insulating film for the pixel electrode, extending over a partial area 117 lying below the pixel electrode 106, is constituted solely by the passivation film 115, as in the first embodiment, so that residual a-Si produced due to patterning defects during the island forming step can be removed simultaneously. This reduces occurrences of defects of semi-bright spots, otherwise caused by increased parasitic capacitance between the drain bus line 112 and the pixel electrode 106 on interconnection to the drain bus line 112 to suppress the reject ratio to improve the production yield.

Moreover, since there is the insulating passivation film 115 as a boundary separating film between the drain bus line 112 and the end of the pixel electrode 106, as in the above-described first embodiment, the structure for reducing the occurrences of the point defects, such as bright or dark spots, ascribable to shorting between the drain bus line 112 and the pixel electrode 106, is realized. Also, the storage capacitance electrode 108 serves simultaneously as the gate bus line 101, the area of the metal film of the storage capacitance electrode can be suppressed to a minimum value.

In addition, since the drain bus line 112 and the pixel electrode 106 are formed in separate layers, the pixel electrode 106 can be increased in area, thus simultaneously increasing the opening ratio.

Figure 8:
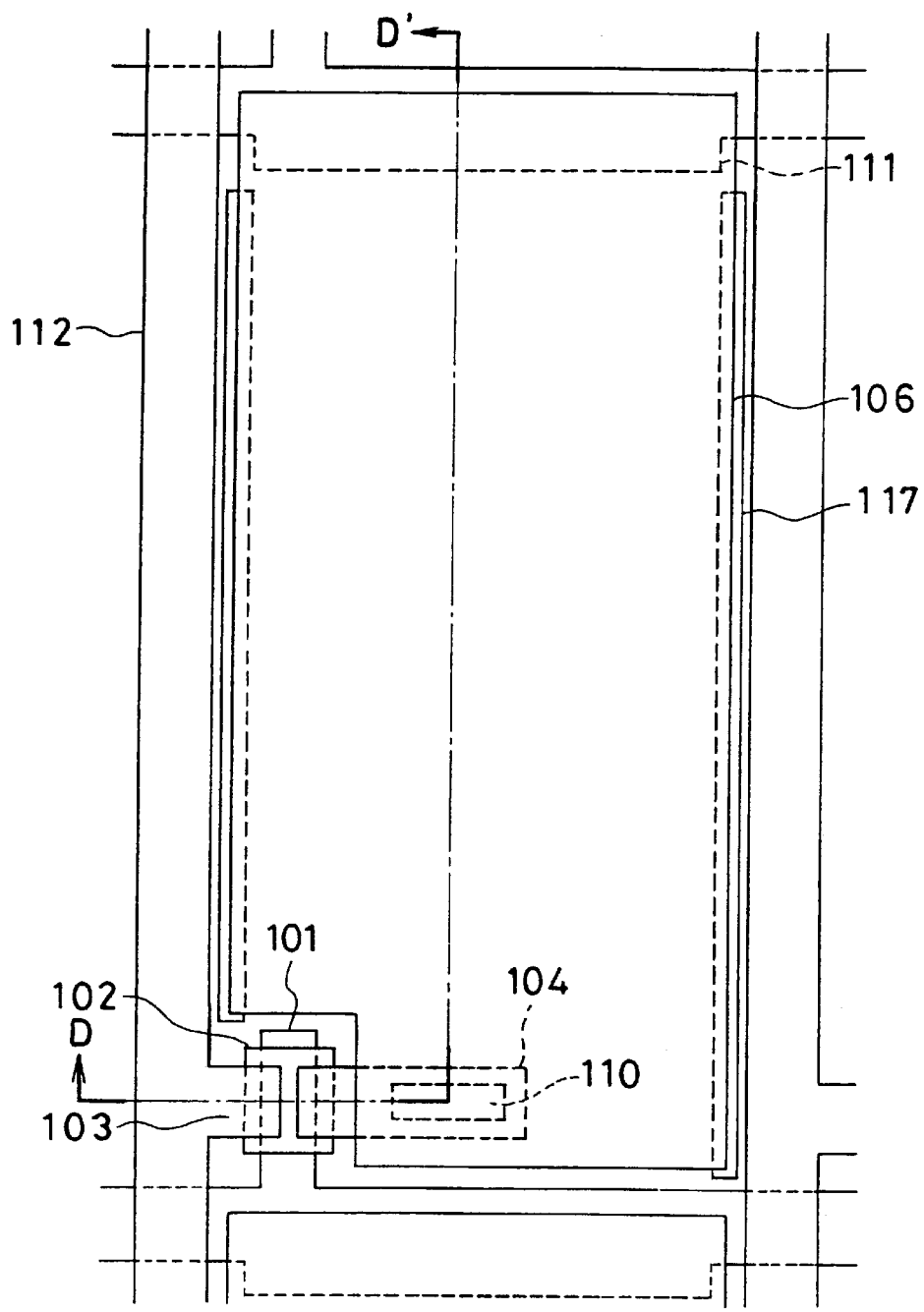
FIG. 8 is a plan view of a thin-film transistor array according to a third embodiment of the present invention.
Figure 9:
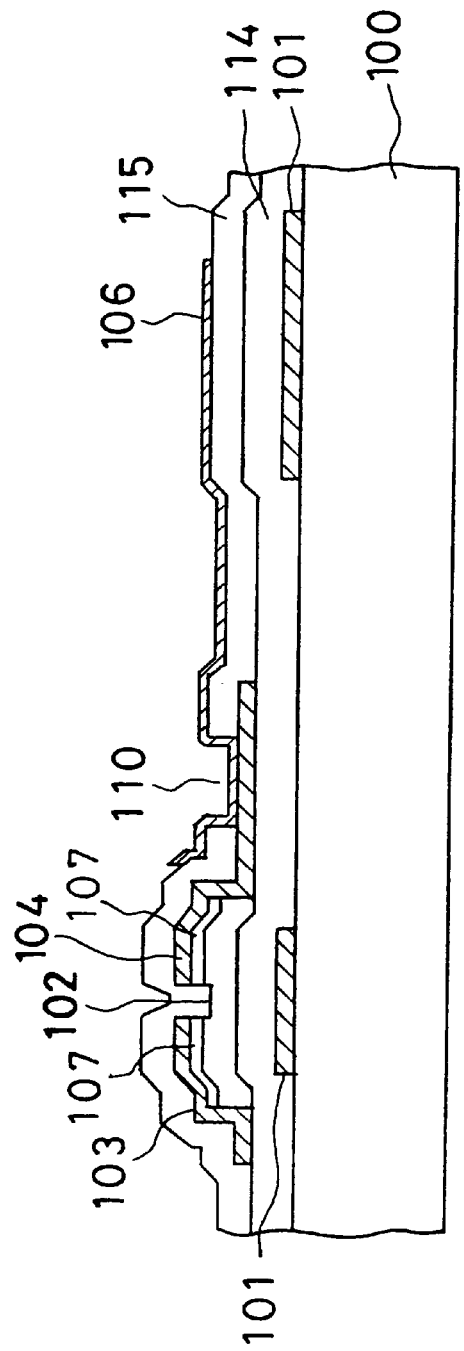
FIG. 9 is a cross-sectional view taken along line D–D' of FIGS. 8 and 22.

FIG. 8 shows a plan view illustrating the structure of a third embodiment of the thin-film transistor array of the present invention and FIG. 9 is a cross-sectional view taken along line D–D' of FIG. 8.

Referring to FIGS. 8 and 9, the structure and the manufacturing method of the third embodiment of the present invention are explained.

The third embodiment of the present invention is characterized in that, in removing the gate insulating film 114 lying below the pixel electrode of each unit pixel, there is formed a removing pattern 117 in the form of a slot a few micrometers in width along the drain bus line 112 and is otherwise the same as the above-described first embodiment.

Figure 10:
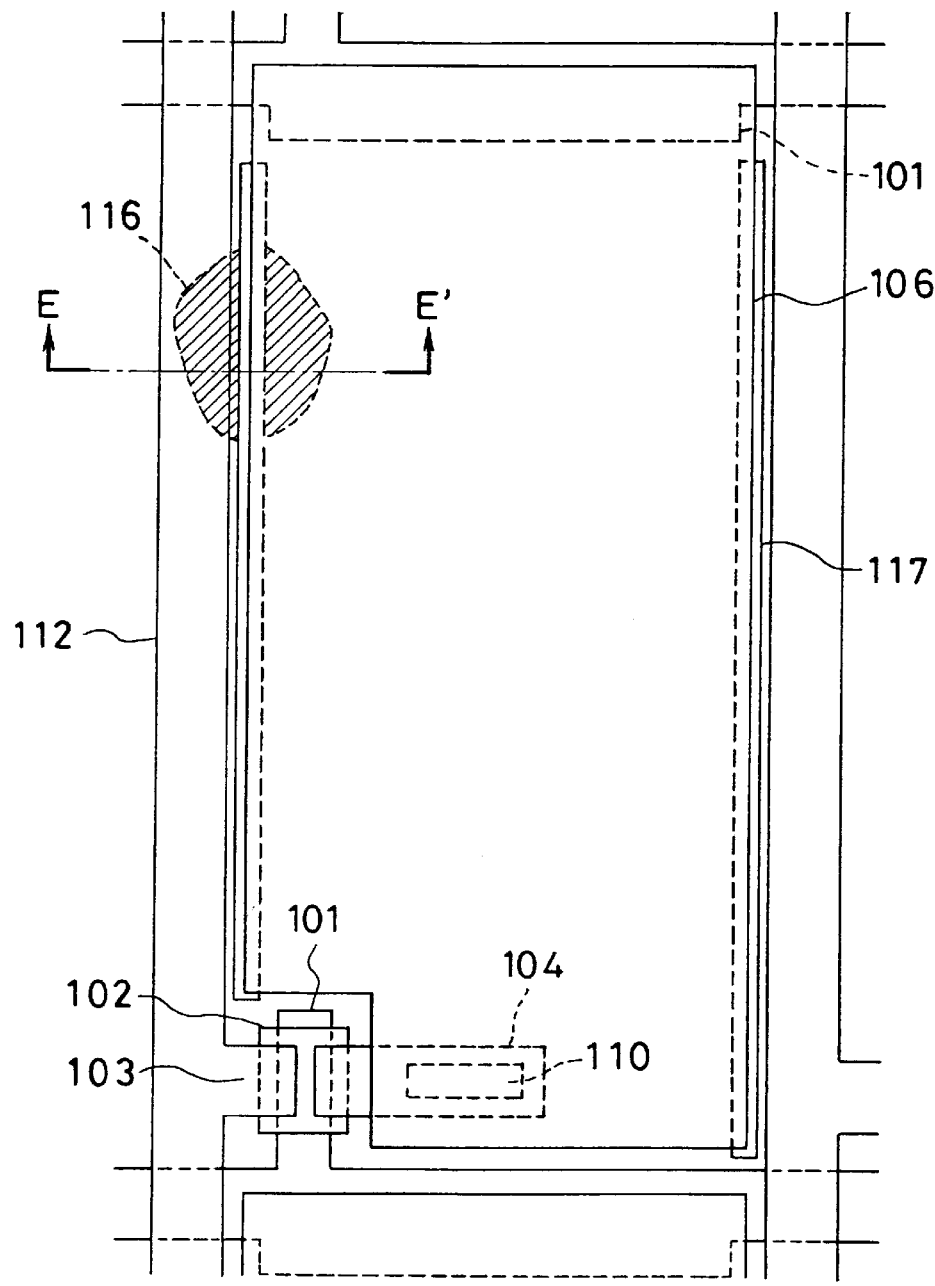
FIG. 10 is a plan view showing a third embodiment of the present invention and particularly showing the state of occurrence of residual a-Si.
Figure 11:
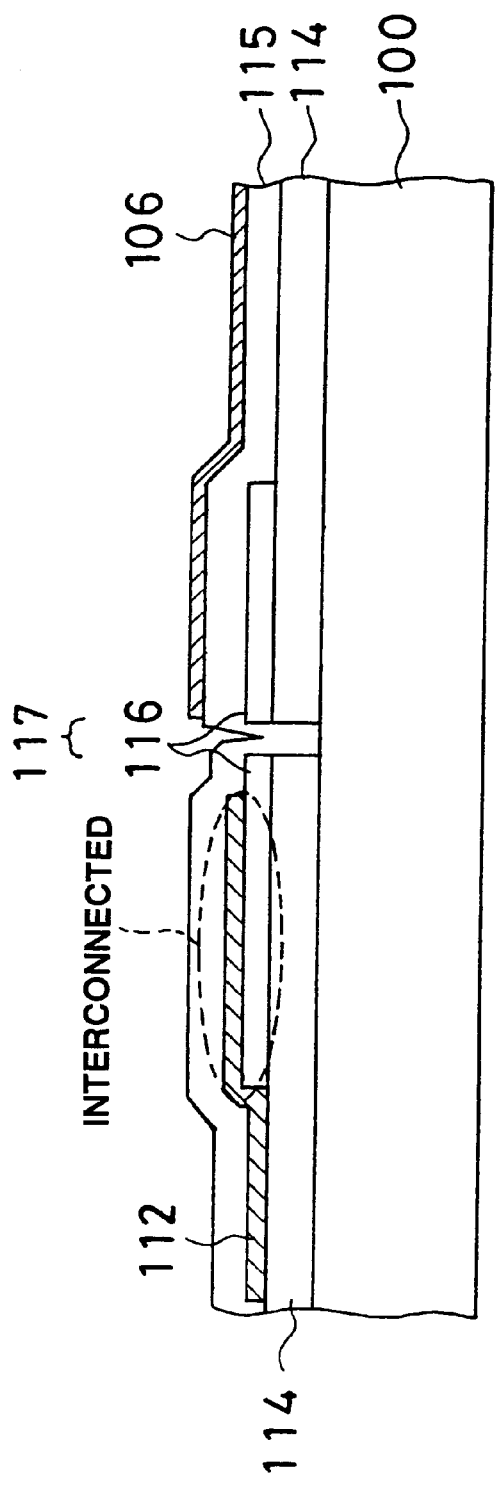
FIG. 11 is a cross-sectional view taken along line E–E' of FIG. 10.

For illustrating the operation and result of the third embodiment of the present invention, FIG. 10 shows a plan view illustrating the state of residual a-Si produced on a pixel. FIG. 11 shows a cross-sectional view taken along line E–E' of FIG. 10.

With the third embodiment of the present invention, the gate insulating film 114 of a partial area 117 lying below the pixel electrode is removed in the contact step in the form of slits several micrometers in width along the drain bus line 112 for simultaneously removing residual a-Si 116 produced due to patterning defects during the island step. This reduces occurrences of point defects of semi-bright spots otherwise produced by increased parasitic capacitances between the drain bus line 112 and the pixel electrode 106 by interconnection to the drain bus line 112 to suppress the reject ratio to improve the product yield.

In the third embodiment, since the residual a-Si removing pattern is slit-shaped, there is no necessity for the pixel electrode to stride over the step at the TFT pixel electrode leadout portion as in the first and second embodiments thus suppressing disconnection failure of the pixel electrode.

In the third embodiment, the residual a-Si removing pattern is formed as slit along the drain bus line 112. However, a similar slit may be formed along the gate bus line 111 simultaneously with the drain bus line 112 for encircling the pixel electrode.

In the third embodiment of the present invention, the storage capacitance electrode is used simultaneously as the gate electrode. However, the third embodiment may be configured for application to an independent type.

If the storage capacitance electrode is used simultaneously as the gate electrode 101, the area of the metal film of the storage capacitance electrode can be suppressed to the smallest value possible. In addition, since the drain bus line 112 and the pixel electrode 106 are formed in separate layers, the pixel electrode 106 can be increased in area, thus simultaneously increasing the opening ratio.

Embodiment 4

Figure 12:
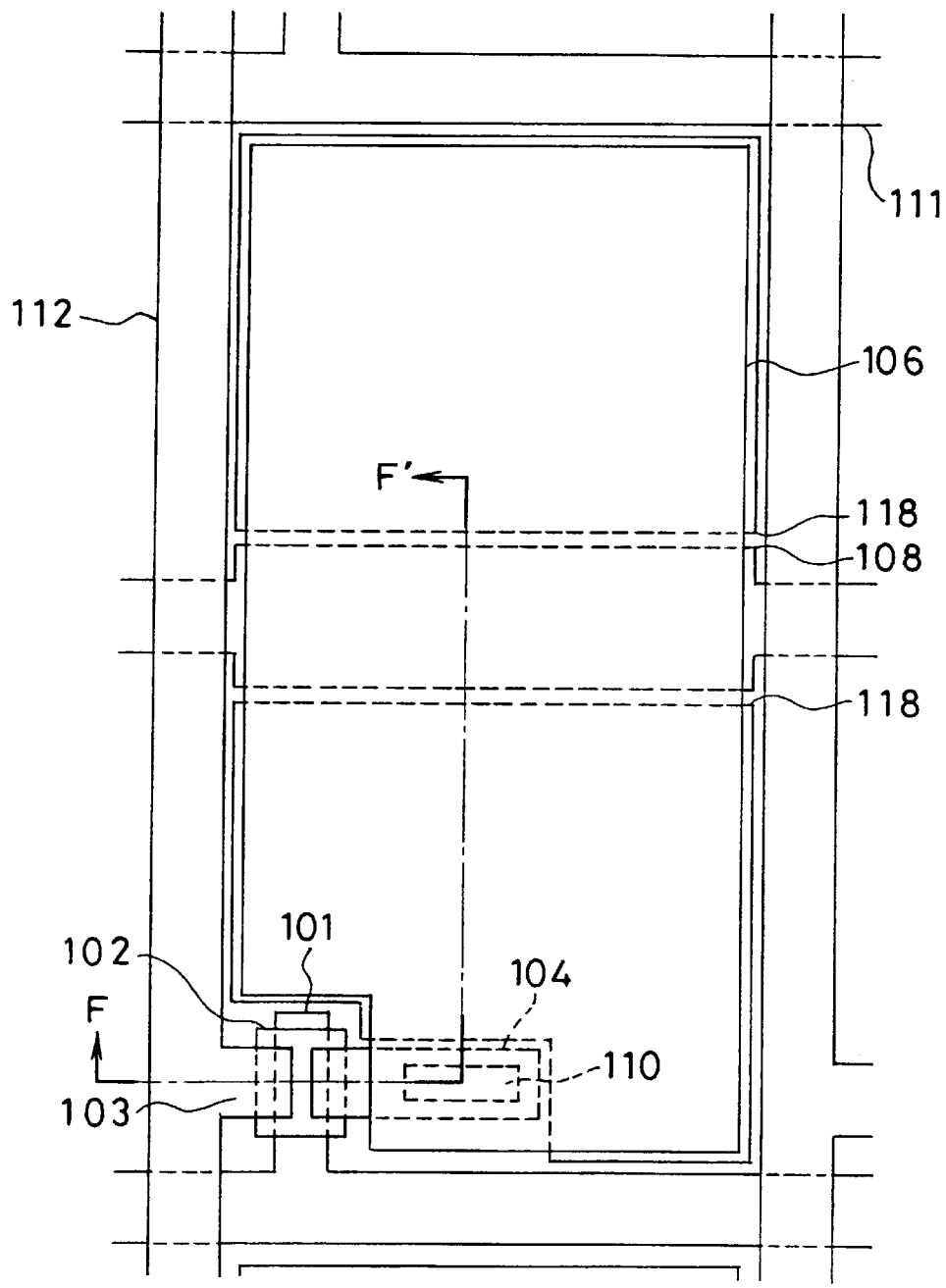
FIG. 12 is a plan view of a thin-film transistor array according to a fourth embodiment of the present invention.
Figure 13:
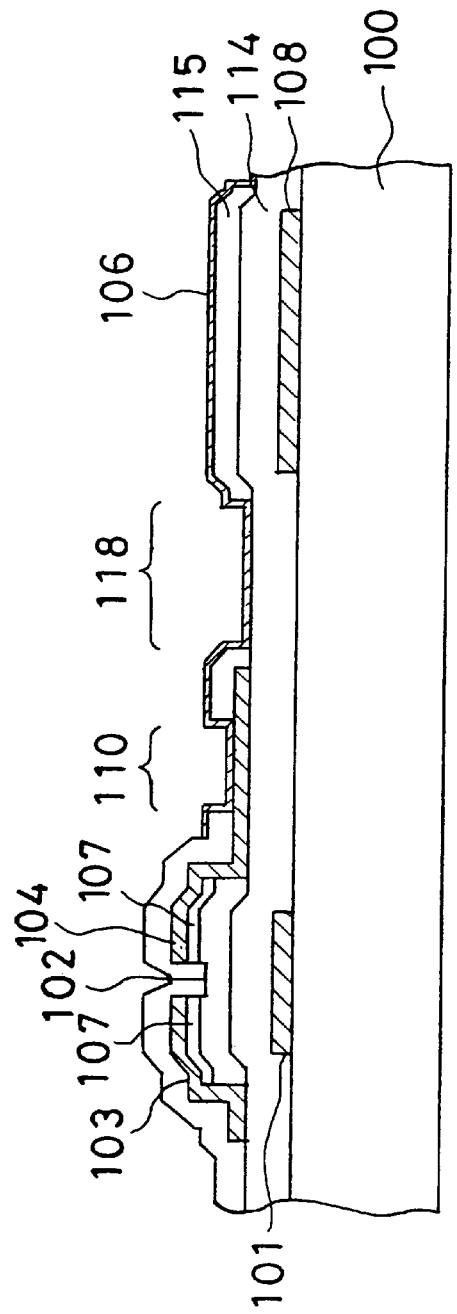
FIG. 13 is a cross-sectional view taken along line F–F' of FIG. 12.

FIG. 12 shows a plan view illustrating the structure of a fourth embodiment of the thin-film transistor array of the present invention and FIG. 13 is a cross-sectional view taken along line F–F' of FIG. 12.

Referring to FIGS. 12 and 13, the structure of the fourth embodiment of the present invention are explained.

The fourth embodiment of the present invention is characterized in that, although two layers of the gate insulating film 114 and the passivation film 115 are present as upper layers for the gate bus line 111 and the gate bus lime 111, an insulating film lying in an area of "removing pattern" 118 lying below the pixel electrode 106 is constituted solely by the gate insulating film 114.

Figure 14:
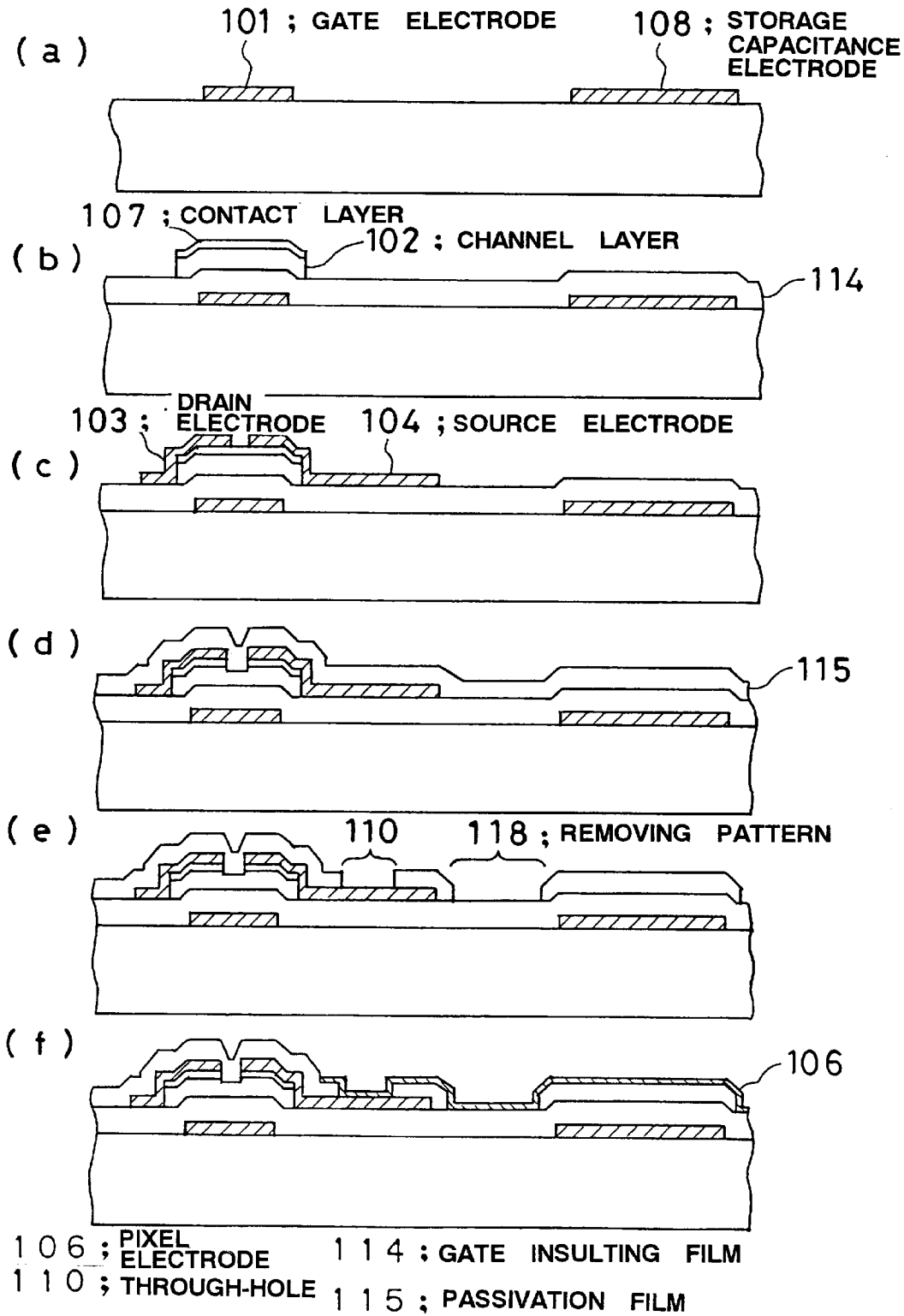
FIG. 14 is a cross-sectional view showing the manufacturing process for the thin-film transistor array according to the fourth embodiment of the present invention.
Figure 15:
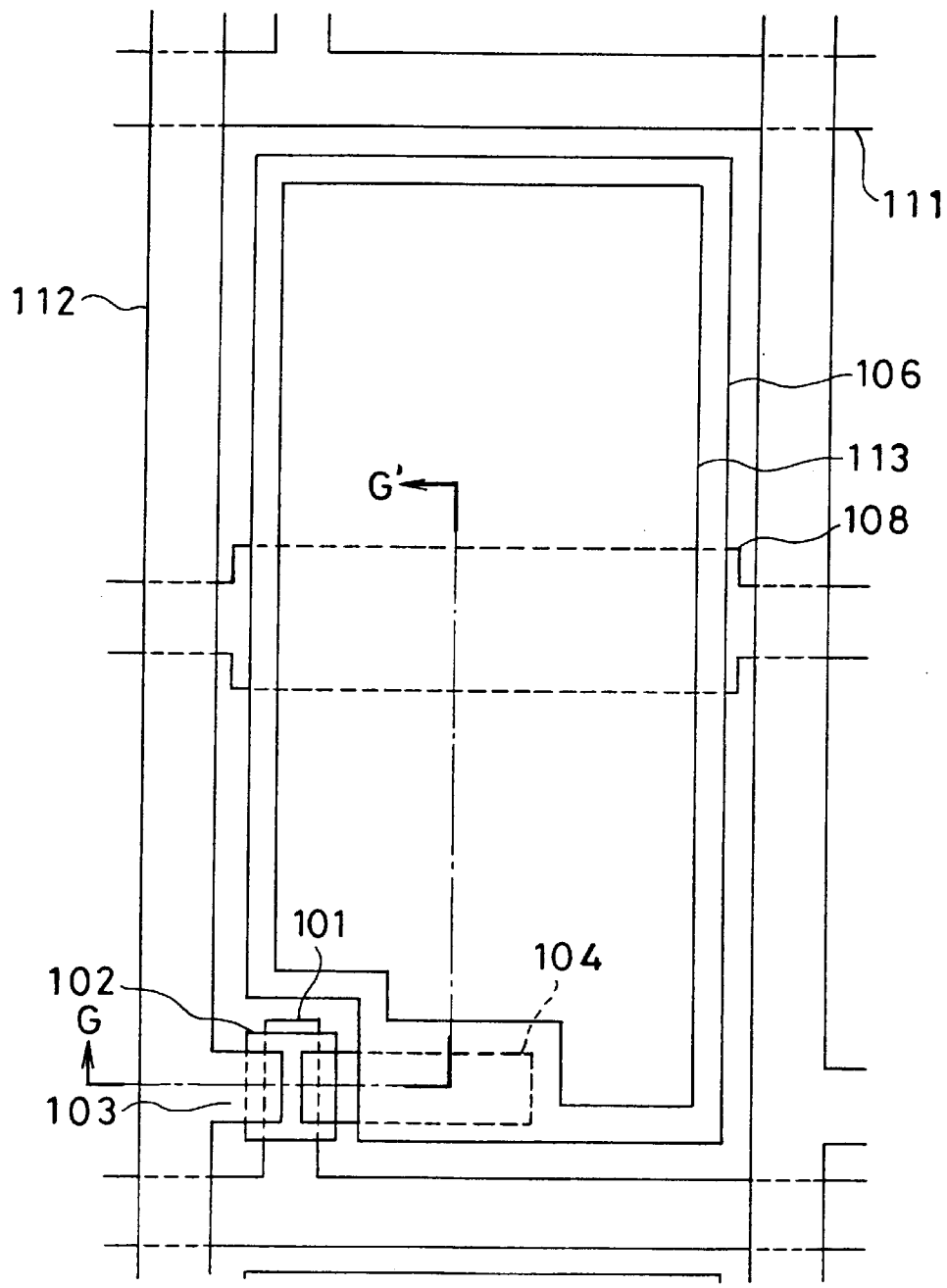
FIG. 15 is a plan view showing a pixel of an active matrix type liquid crystal display device according to a conventional technique (first conventional technique).
Figure 16:
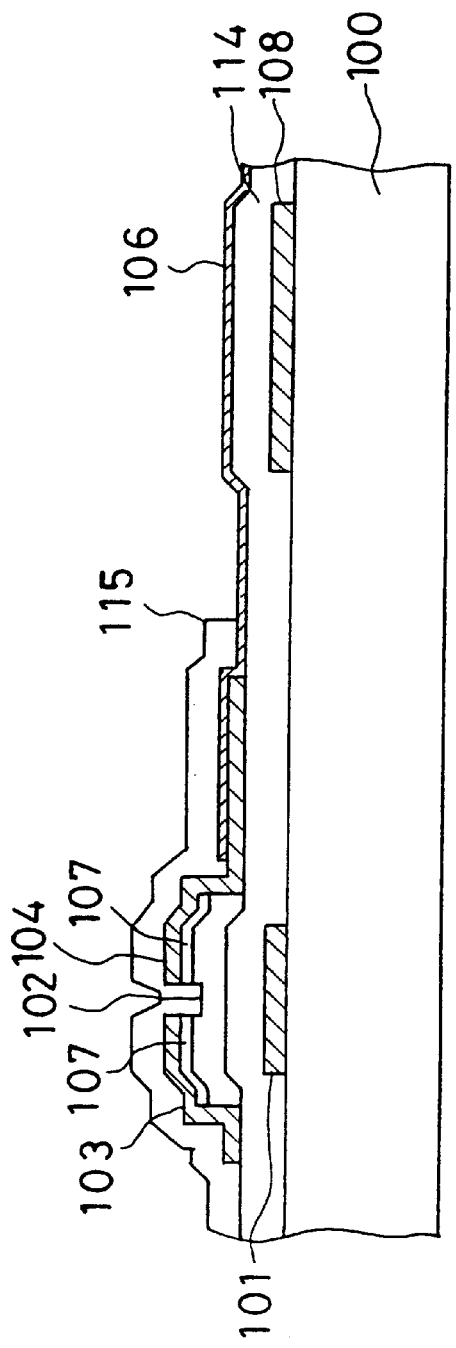
FIG. 16 is a cross-sectional view taken along line G–G' of FIG. 15.
Figure 17:
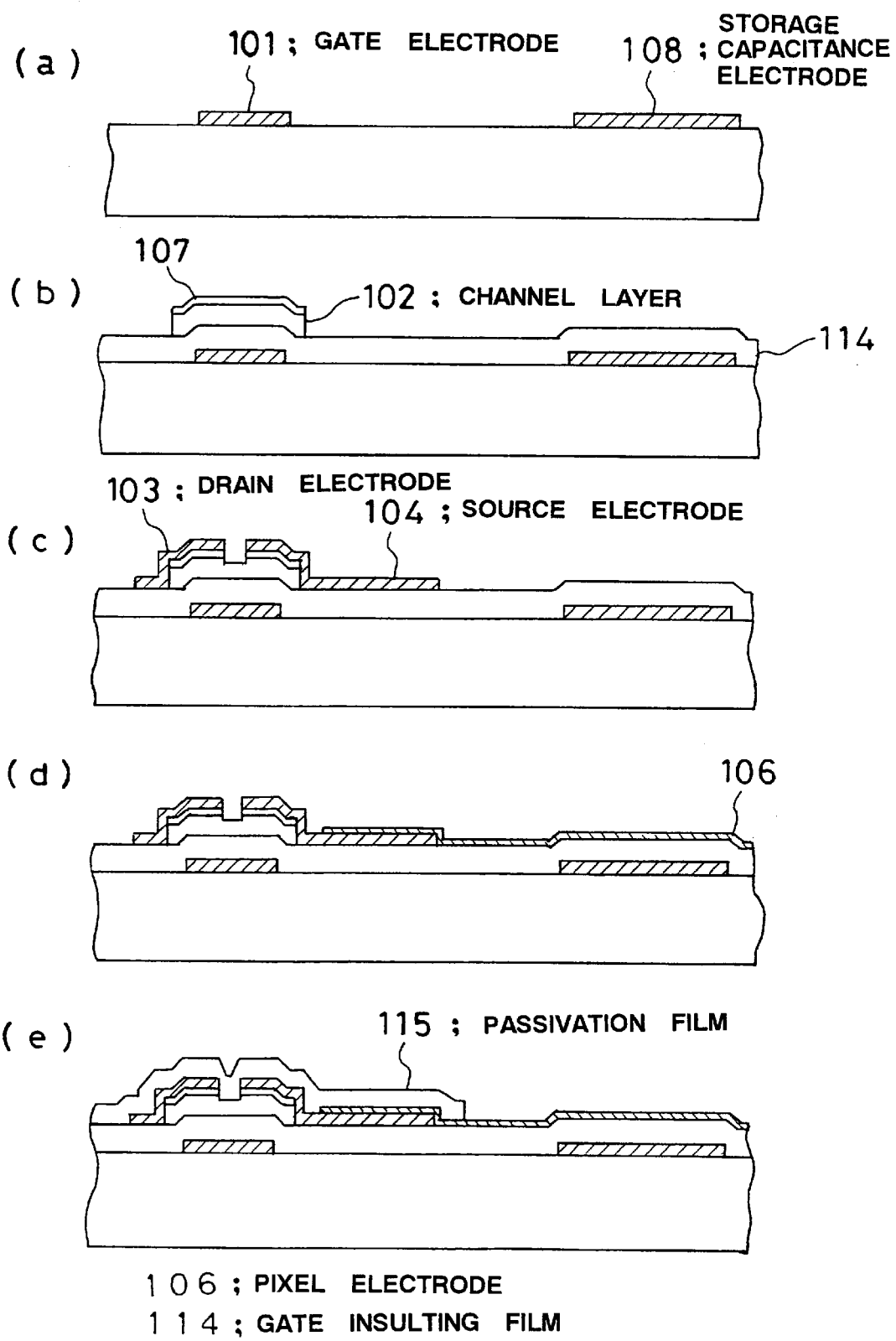
FIG. 17 is a cross-sectional view showing the manufacturing process for the first conventional technique.
Figure 18:
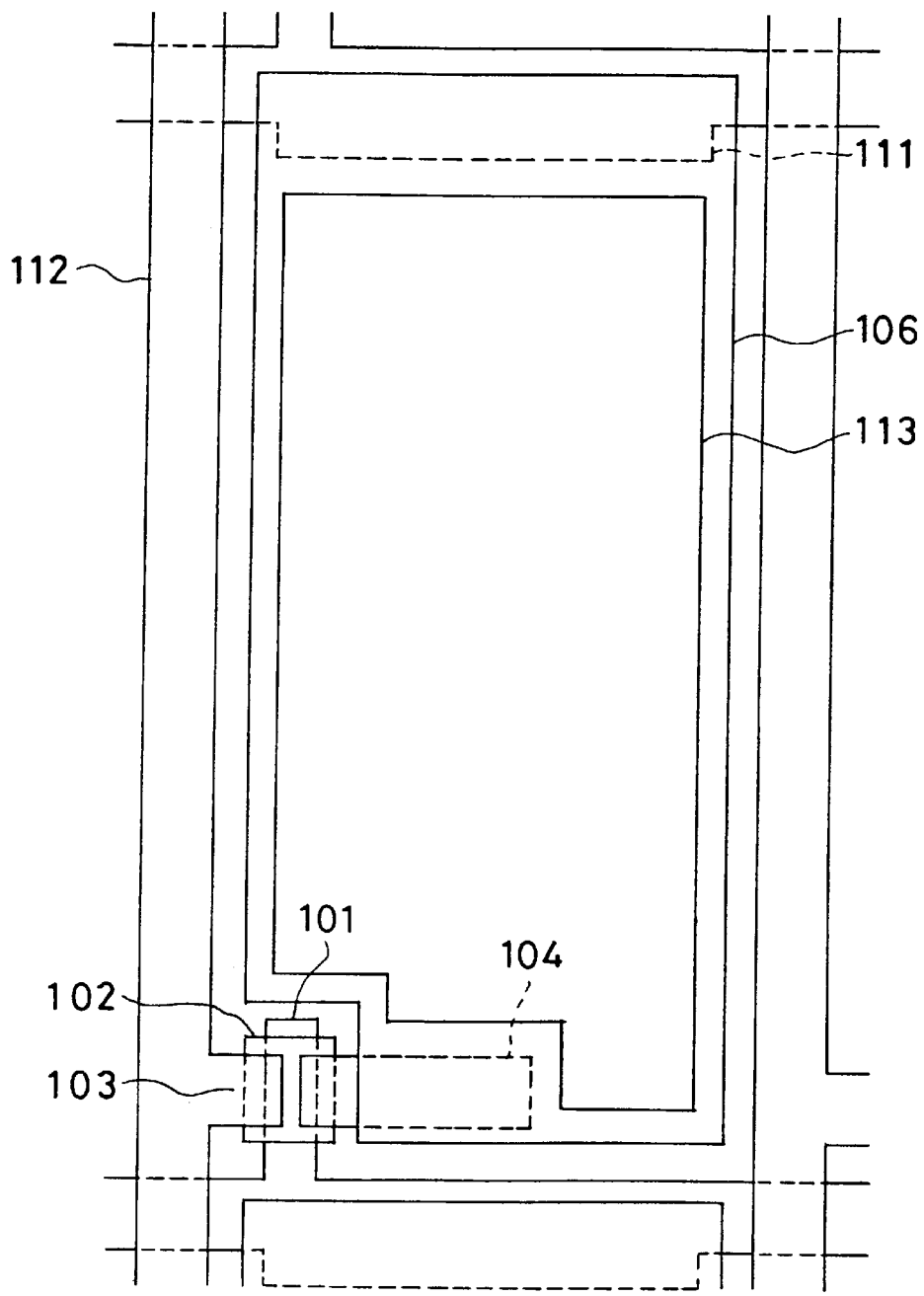
FIG. 18 is a plan view showing a pixel of an active matrix type liquid crystal display device according to another conventional technique (second conventional technique).
Figure 20:
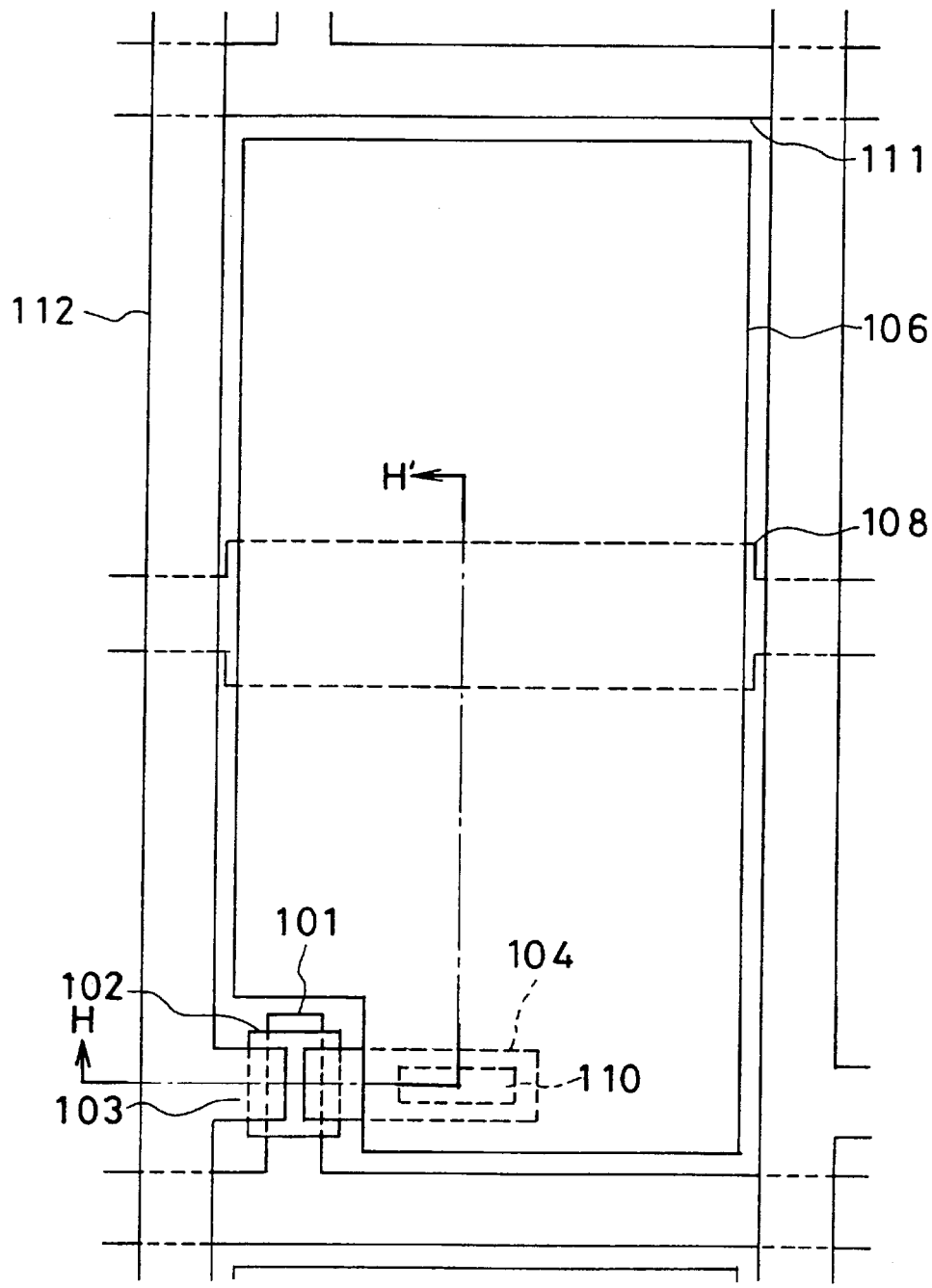
FIG. 20 is a plan view showing a pixel of an active matrix type liquid crystal display device according to still another conventional technique (third conventional technique).
Figure 21:
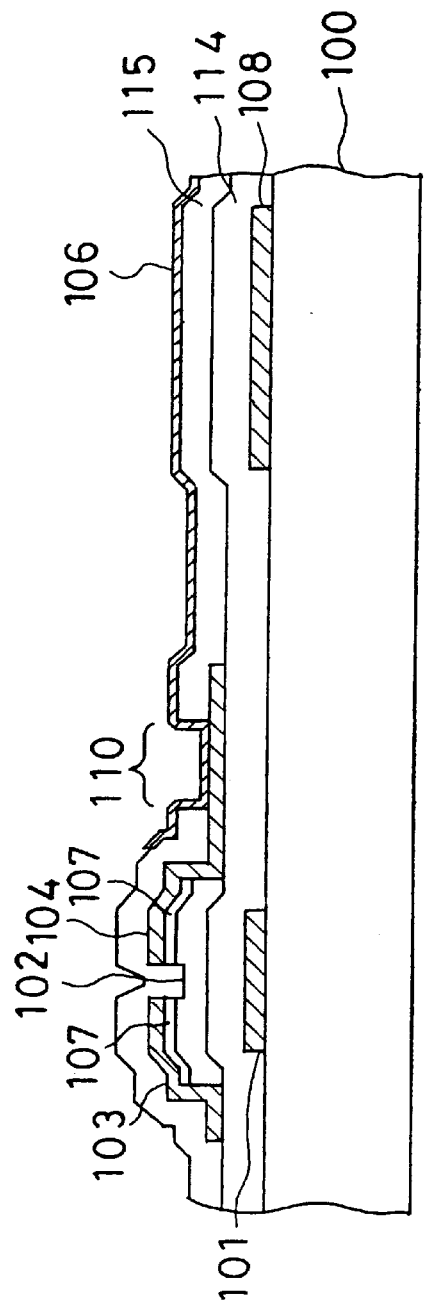
FIG. 21 is a cross-sectional view taken along line H–H' of FIG. 20.
Figure 22:
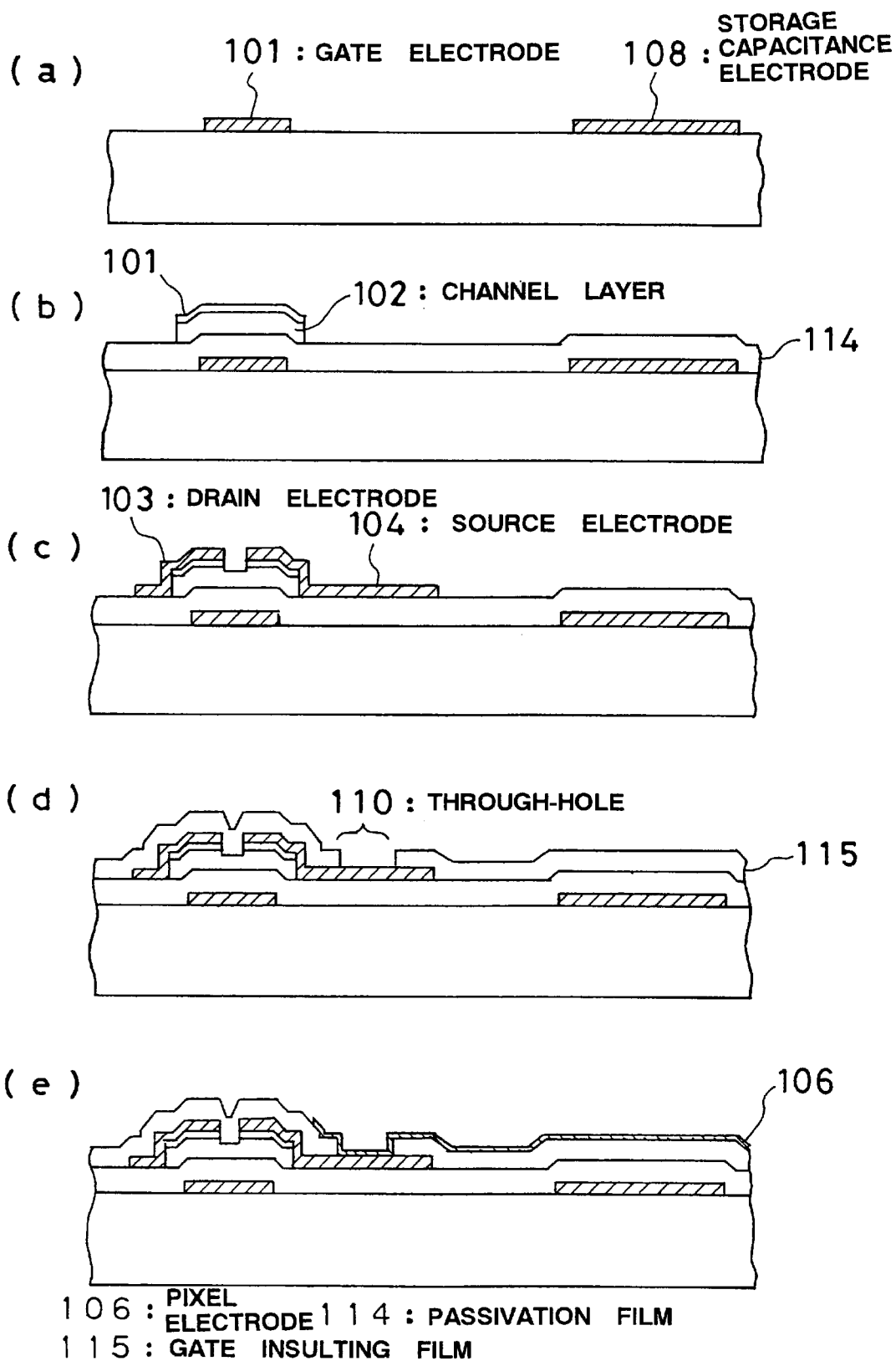
FIG. 22 is a cross-sectional view showing the manufacturing process for the third conventional technique.
Figure 23:
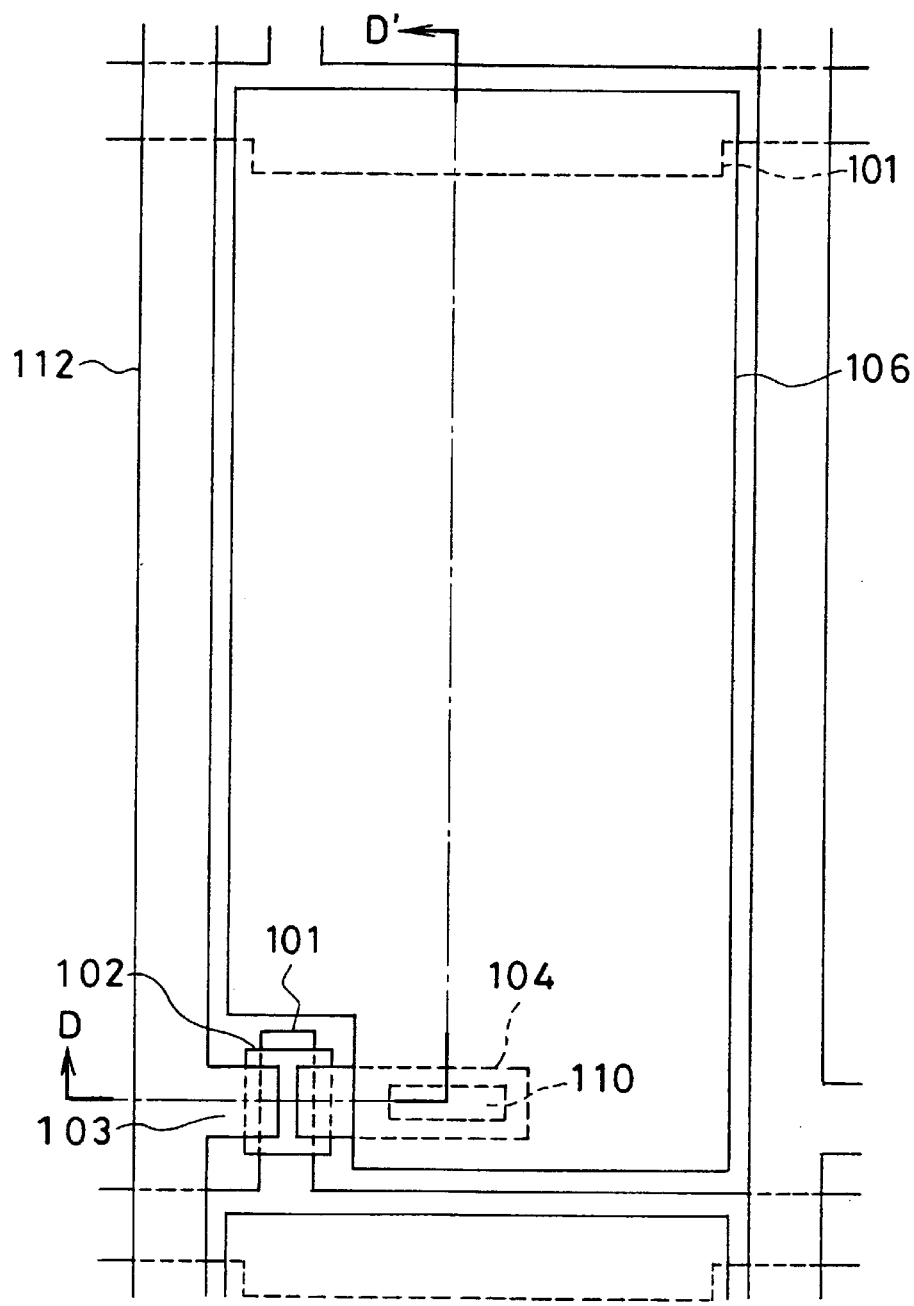
FIG. 23 is a plan view showing a pixel of an active matrix type liquid crystal display device according to yet another conventional technique (fourth conventional technique).
Figure 24:
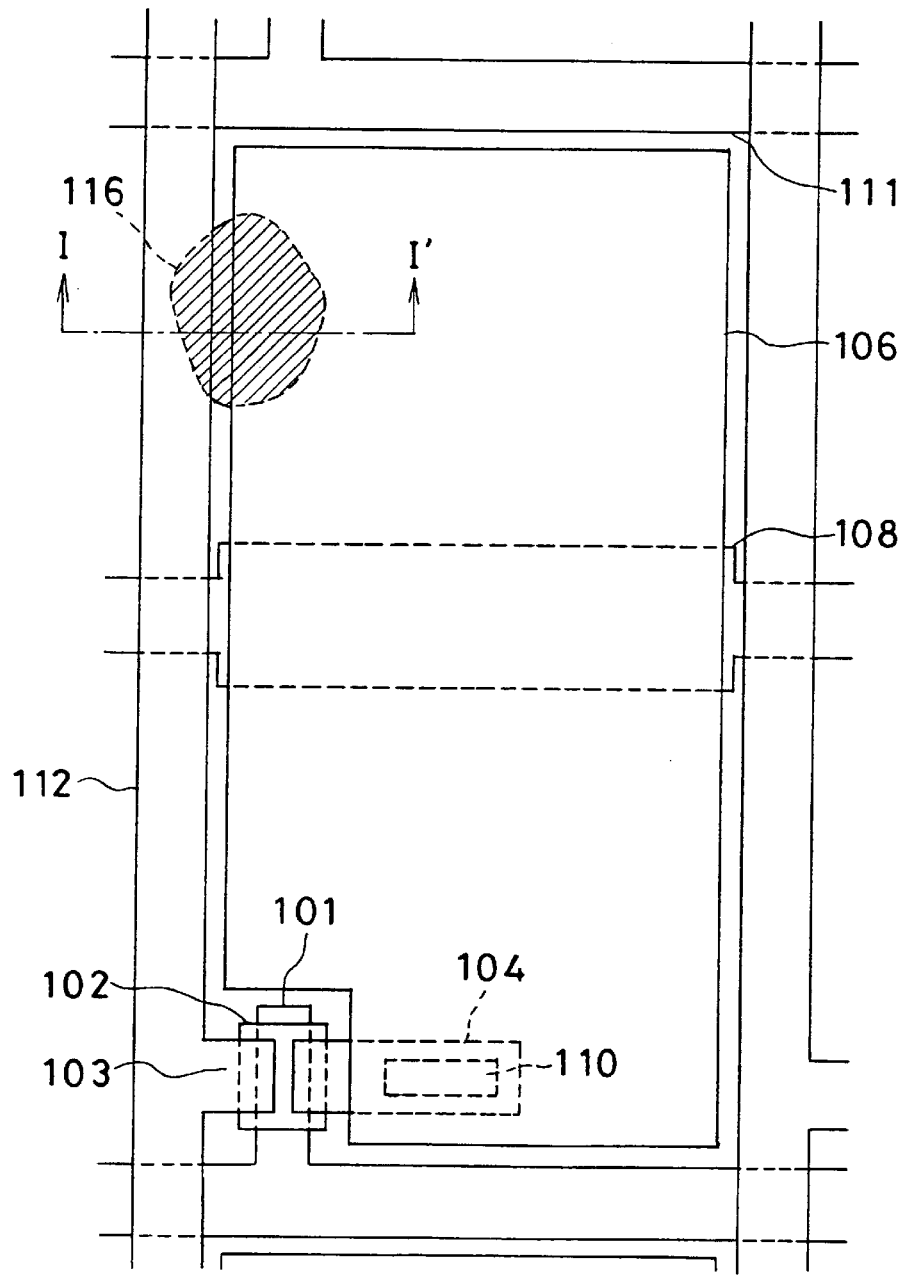
FIG. 24 is a plan view of the fourth conventional technique showing the state in which residual a-Si has been produced.
Figure 25:
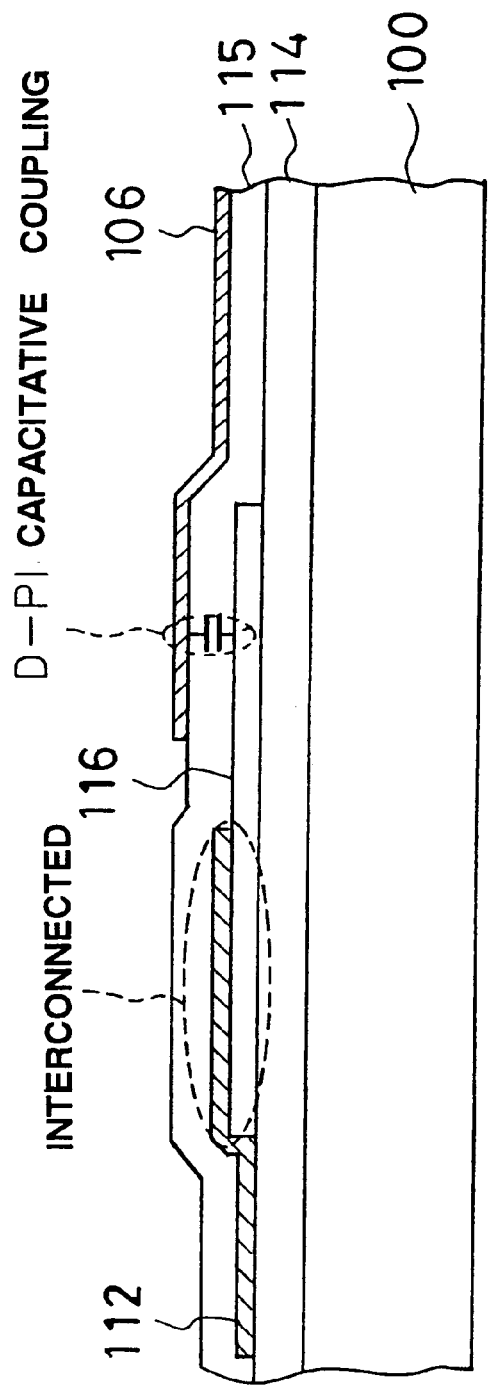
FIG. 25 is a cross-sectional view taken along line I–I' of FIG. 24.

FIG. 14 shows a cross-sectional view for illustrating, step-by-step, the manufacturing process for manufacturing a thin-film transistor array of a fourth embodiment of the present invention shown in FIG. 13. Referring to FIG. 14, the manufacturing method for the fourth embodiment of the present invention is explained.

The gate bus line 111 formed by a metal film of metals, such as Cr or Al, and the gate electrode 101, are patterned on a glass substrate 100, at the same time as a storage capacitance electrode 108 is formed by the same patterning process (see FIG. 14a).

After sequentially forming the gate insulating film 114, channel layer 102 formed of a-Si(I) and a contact layer 107 formed of a-Si(n$^+$), the semiconductor layer is etched (see FIG. 14b) for removing the gate insulating film 114 of the contact area interconnecting the gate layer and the drain layer (not shown).

As the gate electrode 101, the drain electrode 103, source electrode 104 and the drain bus line 112, formed by layers of metals, such as Cr or Al, are formed (see FIG. 14c)

The passivation film 115 is then formed and, in the patterning step of forming the through-hole 110 used for interconnecting the source electrode 104 and the pixel electrode 106, only the passivation film of an area 118 lying below the pixel electrode of each unit device is simultaneously removed, at the same time as the etching rate is adjusted, so that the gate electrode 101 or the storage capacitance electrode 108 will remain unaffected (see FIGS. 14d and 14e).

The pixel electrode 106 is formed for interconnection to the source electrode 104 to complete a TFT array substrate (see FIG. 14f). The structure and the manufacturing method are otherwise the same as those of the above-described first embodiment.

In the fourth embodiment of the present invention, since the insulating film for the pixel electrode below the pixel electrode 106 is constituted solely by the gate insulating film 114, it becomes possible to remove residual a-Si produced due to patterning defects during the island-forming step. This reduces occurrences of point defects of semi-bright spots caused due to the increased parasitic capacitances between the drain bus line 112 and the pixel electrode 106 on interconnection to the drain bus line 112 to suppress the reject ratio to improve the product yield.

In the fourth embodiment of the present invention, a thin residual patterning layer, if any, of the drain metal can be removed to a certain extent by immersion of the gate metal etching liquid after etching the passivation film for a short time such as not to cause significant etching of the drain layer.

Also, in the fourth embodiment of the present invention, only the passivation film of the area 118 lying below the pixel electrode is etched off by the same patterning step as that used for providing the through-hole 110 serving for interconnecting the source electrode 104 with the pixel electrode 106. Thus, the number of the patterning steps remains the same as that of the conventional process thus evading complication of the manufacturing process.

Moreover, since there exists the insulating passivation film 115, as a boundary separating film, between the drain bus line 112 and the pixel electrode 106, as in the first embodiment, the structure of reducing occurrences of point defects of bright and dark spots otherwise caused due to shorting between the drain bus line 112 and the pixel electrode 106 is achieved.

Meanwhile, the fourth embodiment of the present invention is applied to an independent type storage capacitance electrode system. However, the present invention can, of course, be applied to the storage capacitance electrode type in which the storage capacitance electrode is used simultaneously as the gate electrode. In this case, the area of the metal film of the storage capacitance electrode can be suppressed to the smallest value possible. Since the drain bus line 112 and the pixel electrode 106 are formed in separate layers and hence the pixel electrode 106 can be increased in area, the opening ratio can be increased simultaneously.

The present invention is not limited to the above-described embodiments which are given only by way of illustration. For example, the gate electrode, storage capacitance electrode or the source or drain electrodes can be formed by other metal materials or composite films. The gate insulating films or the passivation film may be formed by a variety of insulating films or compound films.

Effects of the Invention are summarized as follows, but not limiting thereto.

According to the present invention, as described above, the following meritorious effects may be achieved:

(1) According to the present invention, since the gate insulating lying below the pixel electrode in roughly its entirety or a slit-like area thereof extending along the drain bus line is removed simultaneously during the step of etching the contact hole, it becomes possible to remove the residual a-Si produced due to patterning defects during the island-forming step. Thus, with the present invention, the point defects of semi-bright spots, otherwise produced by interconnection to the drain bus line and resulting capacitative coupling to the pixel electrode, can be suppressed, thereby reducing the reject ratio to improve product yield.

(2) Also, according to the methods of the present invention, since the entire gate insulating film below the gate electrode of the gate insulating film or a slit-like area of the gate insulating film along the drain bus line is etched off by the same patterning step as that used for providing the through-hole serving for interconnecting the metal film forming the gate electrode and the metal film forming the drain and source electrodes and the drain bus line, the number of the patterning steps is the same as that required in the conventional process, thus evading complication of the manufacturing process.

(3) Moreover, according to the present invention, since there is the passivation film as an insulating/boundary separating film extending between the drain bus line and the pixel electrode, such a structure is obtained in which point defects such as bright and dark spots ascribable to the shorting between the drain bus line and the pixel electrode can be reduced. Further, since the drain bus line and the pixel electrode are provided in different layers, the pixel electrodes can be increased in area thus simultaneously increasing the opening area.

Various aspects, embodiments and any features or elements thereof may be combined together according to the gist of the present invention. Also it should be noted any modifications may be introduced within the gist and scope of the present invention herein disclosed and claimed as appended.

What is claimed is:

1. A thin-film transistor array comprising a matrix array of:

thin-film transistors, each made up of a gate electrode, a gate insulating film, a channel layer, a contact layer, a drain electrode, a source electrode and a passivation film on a transparent glass substrate, and pixel electrodes disposed on the passivation film and electrically connected with the source electrode via an opening portion of the passivation film, with a storage capacitance electrode being provided on the same layer as the gate electrode opposing each pixel electrode and said passivation film being disposed on top of at least said drain electrode, said source electrode and a portion of said gate insulating film, and beneath at least a portion of said pixel electrode, wherein an insulating film of the pixel electrode comprising said gate insulating film and said passivation film is interposed between the pixel electrode of each pixel and the glass substrate, and is formed only by said passivation film in at least a partial area.

2. The thin-film transistor array as defined in claim 1 wherein said insulating film for said pixel electrode is formed only by the passivation film in a slit area extending along the side of said pixel electrode.

3. A thin-film transistor array comprising a matrix array of:

thin-film transistors, each made up of a gate electrode, a gate insulating film, a channel layer, a contact layer, a drain electrode, a source electrode and a passivation film on a transparent glass substrate, and pixel electrodes disposed on the passivation film and electrically connected with the source electrode via an opening portion of the passivation film, with a storage capacitance being provided between each pixel electrode and the gate bus line of the previous stage, and said passivation film being disposed on top of at least said drain electrode, said source electrode and a portion of said gate insulating film, and beneath at least a portion of said pixel electrode, wherein an insulating film of the pixel electrode comprising said gate insulating film and said passivation film is interposed between the pixel electrode of each pixel and the glass substrate, and is formed only by said passivation film in at least a partial area.

4. The thin-film transistor array as defined in claim 3 wherein said insulating film for said pixel electrode is formed only by the passivation film in a slit area extending along the side of said pixel electrode.

5. A thin-film transistor array comprising a matrix array of:

thin-film transistors, each made up of a gate electrode, a gate insulating film, a channel layer, a contact layer, a drain electrode, a source electrode and a passivation film on a transparent glass substrate, and pixel electrodes disposed on the passivation film and electrically connected with the source electrode via an opening portion of the passivation film, with a storage capacitance electrode being provided on the same layer as the gate electrode opposing each pixel electrode and said passivation film being disposed on top of at least said drain electrode, said source electrode and a portion of said gate insulating film, and beneath at least a portion of said pixel electrode, wherein an insulating film of the pixel electrode comprising said gate insulating film and said passivation film is interposed between the pixel electrode of each pixel and the glass substrate, and is formed only by said gate insulating film in at least a partial area.

6. The thin-film transistor array as defined in claim 5 wherein said insulating film for said pixel electrode is formed only by the gate insulating film in a slit area extending along the side of said pixel electrode.

7. A thin-film transistor array comprising a matrix array of:

thin-film transistors, each made up of a gate electrode, a gate insulating film, a channel layer, a contact layer, a drain electrode, a source electrode and a passivation film on a transparent glass substrate, and pixel electrodes disposed on the passivation film and electrically connected with the source electrode via an opening portion of the passivation film, with a storage capacitance being provided between each pixel electrode and the gate bus line of the previous stage, and said passivation film being disposed on top of at least said drain electrode, said source electrode and a portion of said gate insulating film, and beneath at least a portion of said pixel electrode, wherein an insulating film of the pixel electrode comprising said gate insulating film and said passivation film is interposed between the pixel electrode of each pixel and the glass substrate, and is formed only by said gate insulating film in at least a partial area.

8. The thin-film transistor array as defined in claim 7 wherein said insulating film for said pixel electrode is formed only by the gate insulating film in a slit area extending along the side of said pixel electrode.

9. A display device having gate bus lines, drain bus lines, and a thin-film transistor array disposed on a transparent substrate, said thin-film transistor array comprising a matrix array of:

thin-film transistors, each made up of a gate electrode, a gate insulating film, a channel layer, a drain electrode, a source electrode and a passivation film on the substrate, and pixel electrodes disposed on the passivation film and electrically connected with the source electrode, with a storage capacitance electrode being provided on the substrate opposing each pixel electrode and said passivation film being disposed on top of at least said drain electrode, said source electrode and a portion of said gate insulating film, and beneath at least a portion of said pixel electrode, wherein an insulating film of the pixel electrode comprising said gate insulating film and said passivation film is interposed between the pixel electrode of each pixel and the glass substrate, and is formed only by said passivation film in at least a partial area neighboring the gate bus lines and/or drain bus lines.

10. The display device as defined in claim 9 wherein said insulating film for said pixel electrode is formed only by the passivation film in a slit area extending along the side of said pixel electrode.

11. The display device as defined in claim 10, wherein said slit area is formed so as to inhibit capacitive coupling between the drain bus line or gate bus line and the pixel electrode.

12. A display device having gate bus lines, drain bus lines and a thin-film transistor array disposed on a transparent substrate, said thin-film transistor array comprising a matrix array of:

thin-film transistors, each made up of a gate electrode, a gate insulating film, a channel layer, a drain electrode, a source electrode and a passivation film on the substrate, and pixel electrodes disposed on the passivation film and electrically connected with the source electrode, with a storage capacitance being provided between each pixel electrode and the gate bus line of the previous stage, and said passivation film being disposed on top of at least said drain electrode, said source electrode and a portion of said gate insulating film, and beneath at least a portion of said pixel electrode, wherein an insulating film of the pixel electrode comprising said gate insulating film and said passivation film is interposed between the pixel electrode of each pixel and the glass substrate, and is formed only by said passivation film in at least a partial area neighboring the gate bus lines and/or drain bus lines.

13. The display device as defined in claim 12 wherein said insulating film for said pixel electrode is formed only by the passivation film in a slit area extending along the side of said pixel electrode.

14. The display device as defined in claim 13, wherein said slit area is formed so as to inhibit capacitive coupling between the drain bus line or gate bus line and the pixel electrode.

15. A display device having gate bus lines, drain bus lines and a thin-film transistor array disposed on a transparent substrate, said thin-film transistor array comprising a matrix array of:

thin-film transistors, each made up of a gate electrode, a gate insulating film, a channel layer, a contact layer, a drain electrode, a source electrode and a passivation film on a transparent substrate, and pixel electrodes disposed on the passivation film and electrically connected with the source electrode via an opening portion of the passivation film, with a storage capacitance electrode being provided on the same layer as the gate electrode opposing each pixel electrode and said passivation film being disposed on top of at least said drain electrode, said source electrode and a portion of said gate insulating film, and beneath at least a portion of said pixel electrode, wherein an insulating film of the pixel electrode comprising said gate insulating film and said passivation film is interposed between the pixel electrode of each pixel and the glass substrate, and is formed only by said gate insulating film in at least a partial area neighboring the gate bus lines and/or drain bus lines.

16. The display device as defined in claim 15 wherein said insulating film for said pixel electrode is formed only by the gate insulating film in a slit area extending along the side of said pixel electrode.

17. The display device as defined in claim 16, wherein said slit area is formed so as to inhibit capacitive coupling between the drain bus line or gate bus line and the pixel electrode.

18. A display device having gate bus lines, drain bus lines and a thin-film transistor array disposed on a transparent substrate, said thin-film transistor array comprising a matrix array of:

thin-film transistors, each made up of a gate electrode, a gate insulating film, a channel layer, a drain electrode, a source electrode and a passivation film on the substrate, and pixel electrodes disposed on the passivation film and electrically connected with the source electrode, with a storage capacitance being provided between each pixel electrode and the gate bus line of the previous stage, and said passivation film being disposed on top of at least said drain electrode, said source electrode and a portion of said gate insulating film, and beneath at least a portion of said pixel electrode, wherein an insulating film of the pixel electrode comprising said gate insulating film and said passivation film is interposed between the pixel electrode of each pixel and the glass substrate, and is formed only by said gate insulating film in at least a partial are neighboring the gate bus lines and/or drain bus lines.

19. The display device as defined in claim 18 wherein said insulating film for said pixel electrode is formed only by the gate insulating film in a slit area extending along the side of said pixel electrode.

20. The display device as defined in claim 19, wherein said slit area is formed so as to inhibit capacitive coupling between the drain bus line or gate bus line and the pixel electrode.

21. A display device having gate bus lines, drain bus lines and a thin-film transistor array disposed on a transparent substrate, said thin-film transistor array comprising a matrix array of thin-film transistors, each further comprising:

a gate electrode disposed on said transparent substrate and connected with a respective gate bus line;

a storage capacitance electrode disposed on said transparent substrate, and provided on the same layer as the gate electrode;

a gate insulating film disposed on said gate electrode and said storage capacitance electrode;

a channel layer disposed on said gate insulating film and over said gate electrode;

a contact layer disposed on said channel layer;

a drain electrode disposed on a portion of said channel layer and connected with a respective drain bus line;

a source electrode disposed on a portion of said channel layer and a portion of said transparent substrate, and provided on the same layer as said drain electrode;

a passivation film disposed on a portion of said transparent substrate, a portion of said gate insulating film, and a portion of said source and drain electrodes; and a pixel electrode disposed on said passivation film over at least a portion of said storage capacitance electrode and electrically connected with the source electrode via an opening portion of said passivation film;

wherein an insulating film of the pixel electrode comprising said gate insulating film and said passivation film is interposed between the pixel electrode of each pixel and the glass substrate, and is formed only by said passivation film in at least a partial area neighboring the gate bus lines and/or drain bus lines, so that said pixel electrode and the gate bus line and/or drain bus line are provided in different layers of the thin-film transistor.

22. The display device of claim 21, wherein said pixel electrodes are disposed so as to cover said storage capacitance electrodes.

23. The display device of claim 22, wherein said insulating film for said pixel electrode is formed only by said passivation film in a rectangular area extending laterally along the side of said pixel electrode from said transparent substrate to said pixel electrode.

24. The display device of claim 21, wherein said pixel electrodes are disposed so as to partially cover said storage capacitance electrodes which are provided between each pixel electrode and the gate bus line of the previous stage.

25. The display device of claim 24, wherein said insulating film for said pixel electrode is formed only by said passivation film in a rectangular area extending laterally along the side of said pixel electrode from said transparent substrate to said pixel electrode.

26. The display device of claim 21, wherein said insulating film for said pixel electrode is formed only by said passivation film in a rectangular area extending laterally along the side of said pixel electrode from said transparent substrate to said pixel electrode.

27. A display device having gate bus lines, drain bus lines and a thin-film transistor array disposed on a transparent substrate, said thin-film transistor array comprising a matrix array of thin-film transistors, each further comprising:

a gate electrode disposed on said transparent substrate and connected with a respective gate bus line;

a storage capacitance electrode disposed on said transparent substrate, and provided on the same layer as the gate electrode;

a gate insulating film disposed on said gate electrode and said storage capacitance electrode;

a channel layer disposed on said gate insulating film and over said gate electrode;

a contact layer disposed on said channel layer;

a drain electrode disposed on a portion of said channel layer and connected with a respective drain bus line;

a source electrode disposed on a portion of said channel layer and a portion of said gate insulating film, and provided on the same layer as said drain electrode;

a passivation film disposed on a portion of said gate insulating film, and a portion of said source and drain electrodes; and a pixel electrode disposed on said passivation film over at least a portion of said storage capacitance electrode and electrically connected with the source electrode via an opening portion of said passivation film;

wherein an insulating film of the pixel electrode comprising said gate insulating film and said passivation film is interposed between the pixel electrode of each pixel and the glass substrate, and is formed only by said gate insulating film in at least a partial area neighboring the gate bus line and/or drain bus line, so that said pixel electrode and the gate bus line and/or drain bus line are provided in different layers of the thin-film transistor.

28. The display device of claim 27, wherein said pixel electrodes are disposed so as to cover said storage capacitance electrodes.

29. The display device of claim 28, wherein said insulating film for said pixel electrode is formed only by said gate insulating film in a rectangular area extending laterally along the side of said pixel electrode from said transparent substrate to said pixel electrode.

30. The display device of claim 27, wherein said pixel electrodes are disposed so as to partially cover said storage capacitance electrodes which are provided between each pixel electrode and the gate bus line of the previous stage.

31. The display device of claim 30, wherein said insulating film for said pixel electrode is formed only by said gate insulating film in a rectangular area extending laterally along the side of said pixel electrode from said transparent substrate to said pixel electrode.

32. The display device of claim 27, wherein said insulating film for said pixel electrode is formed only by said gate insulating film in a rectangular area extending laterally along the side of said pixel electrode from said transparent substrate to said pixel electrode.

* * * * *

UNITED STATES PATENT AND TRADEMARK OFFICE
CERTIFICATE OF CORRECTION

PATENT NO.: 6,121,632
DATED: September 19, 2000
INVENTOR(S): Naoyuki TAGUCHI, Susumu OHI It is certified that error(s) appears in the above-identified patent and that said Letters Patent is hereby corrected as shown below:

Column 20, line 21, delete "21" insert --25--;

line 24, delete "22" insert --24--;

line 29, delete "21" insert --24--;

line 33, delete "24" insert --25--;

line 48, delete "21" insert --26--.

Column 21, line 12, delete "27" insert --24--;

line 15, delete "28" insert --27--.

Column 22, line 3, delete "27" insert --25--;

line 7, delete "30" insert --28--;

line 11, delete "27" insert --29--.

Signed and Sealed this

Twenty-second Day of May, 2001

*Attest:*

NICHOLAS P. GODICI

*Attesting Officer*   Acting Director of the United States Patent and Trademark Office